(12) United States Patent
Kim et al.

(10) Patent No.: US 6,795,336 B2
(45) Date of Patent: Sep. 21, 2004

(54) MAGNETIC RANDOM ACCESS MEMORY

(75) Inventors: Jung Hwan Kim, Seoul (KR); Hee Bok Kang, Daejeon-shi (KR); Geun Il Lee, Kyoungki-do (KR)

(73) Assignee: Hynix Semiconductor Inc., Ichon-shi (KR)

(*) Notice: Subject to any disclaimer, the term of this patent is extended or adjusted under 35 U.S.C. 154(b) by 58 days.

(21) Appl. No.: 10/278,070

(22) Filed: Oct. 23, 2002

(65) Prior Publication Data
US 2003/0107915 A1 Jun. 12, 2003

(30) Foreign Application Priority Data

Dec. 7, 2001 (KR) .................................... 2001-0077168
Dec. 7, 2001 (KR) ........................................ 2001-77171

(51) Int. Cl.[7] ............................................... G11C 7/00
(52) U.S. Cl. ..................... 365/158; 365/97; 365/66; 365/55; 365/8; 365/33; 365/196
(58) Field of Search ............................ 365/158, 97, 68, 365/55, 8, 33, 196

(56) References Cited

U.S. PATENT DOCUMENTS

| | | | | |
|---|---|---|---|---|
| 4,809,225 A | * | 2/1989 | Dimmler et al. ............ 365/149 |
| 5,664,579 A | * | 9/1997 | Caillouette .................. 600/572 |
| 6,215,707 B1 | * | 4/2001 | Moyer .................... 365/189.07 |
| 6,473,336 B1 | * | 10/2002 | Nakajima et al. ........... 365/171 |
| 6,490,194 B2 | * | 12/2002 | Hoenigschmid ............ 365/158 |
| 6,549,455 B2 | * | 4/2003 | Yamada ...................... 365/158 |
| 6,625,057 B2 | * | 9/2003 | Iwata ......................... 365/158 |
| 6,649,953 B2 | * | 11/2003 | Cha ........................... 257/295 |
| 6,677,165 B1 | * | 1/2004 | Lu et al. ......................... 438/3 |
| 6,711,068 B2 | * | 3/2004 | Subramanian ......... 365/189.02 |
| 2002/0006058 A1 | * | 1/2002 | Nakajima et al. ........... 365/171 |
| 2002/0054500 A1 | * | 5/2002 | Yamada ....................... 365/97 |
| 2003/0107916 A1 | * | 6/2003 | Ooishi ........................ 365/171 |

FOREIGN PATENT DOCUMENTS

| JP | 02002260377 A | * | 9/2002 | .......... G11C/11/14 |
|---|---|---|---|---|
| JP | 02003163334 A | * | 6/2003 | ......... H01L/27/105 |

* cited by examiner

Primary Examiner—Viet Q. Nguyen
(74) Attorney, Agent, or Firm—Pillsbury Winthrop LLP

(57) ABSTRACT

The present invention discloses a magnetic random access memory for reading two or more data, by sensing the current flowing into source and drain regions. The current is regulated by the amount of a current flowing through an MRJ in an MRAM cell according to a word line voltage. In order to accomplish this object of the present invention, the MRAM comprises a data detecting circuit for converting a current flowing through an MTJ in the MRAM cell into a voltage and detecting data resulting in magnetization orientation ge.

51 Claims, 30 Drawing Sheets

| | D1 | D2 | D3 | X | Y |
|---|---|---|---|---|---|
| A | L | L | L | L | L |
| B | H | L | L | L | H |
| C | H | H | L | H | L |
| D | H | H | H | H | H |

|   | D1 | D2 | D3 | D4 | D5 | D6 | D7 | X | Y | Z |
|---|----|----|----|----|----|----|----|---|---|---|
| A | L | L | L | L | L | L | L | L | L | L |
| B | H | L | L | L | L | L | L | L | L | H |
| C | H | H | L | L | L | L | L | L | H | L |
| D | H | H | H | L | L | L | L | L | H | H |
| E | H | H | H | H | L | L | L | H | L | L |
| F | H | H | H | H | H | L | L | H | L | H |
| G | H | H | H | H | H | H | L | H | H | L |
| H | H | H | H | H | H | H | H | H | H | H |

Fig.22

MAGNETIC RANDOM ACCESS MEMORY

BACKGROUND OF THE INVENTION

1. Field of the Invention

The present invention generally relates to a magnetic random access memory (hereinafter, referred to as 'MRAM'), and in particular, to an MRAM having magnetic tunnel junctions (hereinafter, referred to as 'MTJ') between gate metal electrodes and active regions of semiconductor substrates, the MRAM which can read and write two or more data by controlling current flowing through MTJ and current flowing from drain region to source region.

2. Description of the Prior Art

Nonvolatile memories are more required to overcome limitations of volatile memories as the demand for portable or communication appliances increases. The volatile memories may lose data when power is turned off. However, the nonvolatile memories are not restricted in number of write and read. As a result, MRAMs is developed using differences of magnetic resistance according to relative arrangements in electrodes.

The MRAM store magnetic polarization in a magnetic thin film, and perform read and write operations by changing or sensing magnetization orientation according to magnetic fields generated by combining currents in bit and word lines.

The MRAM may be embodied by using alternative magnetoresistive effects such as GMR (giant magneto resistance) or spin polarization magneto permeation, which are generated due to influence of spins on transmission of electrons. In general, the MRAMs read and write data by utilizing devices using magnetic phenomena such as GMR or MTJ as memory cell.

First, the MRAM using giant magneto resistance is embodied by using a phenomenon wherein resistance is more differentiated when spin directions are anti-parallel than when parallel in two magnetic layers having an insulating layer therebetween. Second, the MRAM using spin polarization magnetic permeation is embodied by using a phenomenon wherein the current is better permeated when spin directions are parallel than when anti-parallel in two magnetic layers having an insulating layer therebetween.

FIG. 1 is a diagram of a cell array of the conventional MRAM.

An MRAM cell of FIG. 1 includes a plurality of word lines WL1~WL4, a plurality of bit lines BL1~BL2 and sense amplifiers SA1 and SA2 coupled with a plurality of bit lines BL1 and BL2. A cell 1 selected by word lines and bit lines includes a switching transistor T and an MTJ.

First, when a word line WL4 of a plurality word lines WL1~WL4 is selected by a word line selecting signal, a predetermined voltage is applied to an MTJ by turn-on of a switching transistor T. As a result, a current having different values according to the magnetization orientation of an MTJ flows into a selected bit line BL2, and then a sense amplifier SA2 senses the current of the bit line BL2.

FIGS. 2a and 2b are diagrams of the above-described MTJs.

As shown in FIGS. 2a and 2b, the top portion of an MTJ includes a free ferromagnetic layer 2, and its bottom of a fixed ferromagnetic layer 4. The free ferromagnetic layer 2 and the fixed ferromagnetic layer 4 consists of NiFeCo/CoFe.

The thickness of the free ferromagnetic layer 2 is different from that of the fixed ferromagnetic layer 4. The fixed ferromagnetic layer 4 changes the magnetization orientation only by a strong magnetic field. On the contrary, the free ferromagnetic layer 2 changes the magnetization orientation only by a weak magnetic field. Here, if a weak magnetic field is used, the magnetization orientation of a free ferromagnetic layer is changed, whilethat of a fixed ferromagnetic layer is fixed at one direction, and then a fixed layer is formed. As a result, a magnetic field is generated to change only the magnetization orientation of the top layer without changing the magnetization orientation of the bottom layer during the write operation.

A tunnel oxide film 3 is formed between a free ferromagnetic layer 2 and a fixed ferromagnetic layer 4, the tunnel oxide film 3 consisting of $Al_2O_3$.

Here, FIG. 2a shows an example of parallel magnetization orientations in a free ferromagnetic layer 2 and a fixed ferromagnetic layer 4. If the magnetization orientation is parallel, a current increases.

FIG. 2b shows an example of anti-parallel magnetization orientations in a free ferromagnetic layer 2 and a fixed ferromagnetic layer 4. If the magnetization orientation is anti-parallel, a current decreases.

Here, the magnetization orientation of a free ferromagnetic layer 2 is changed by an external magnetic field. An MRAM cell stores logic values of "o" and "1" according to the magnetization orientation of the free ferromagnetic layer 2.

However, since a conventional MRAM cell includes 1T+1MTJ, the cell has the complicated structure and the difficult process. The conventional MRAM also has the problem in the cell size.

SUMMARY OF THE INVENTION

Accordingly, it is the first object of the present invention to provide an MRAM for reading/writing data from/to an MRAM cell by adjusting a current flowing in an MTJ according to the volume of voltages applied to word lines.

It is the second object of the present invention to provide an MRAM for reading data from an MRAM cell by adjusting the amount of a current flowing from a drain region to a source region, by the amount of a current flowing through an MTJ of an MRAM cell, according to the volume of voltages in word lines.

It is the third object of the present invention to provide an MRAM for reading/writing two or more data, thereby reducing a cell size of MRAM.

It is the forth object of the present invention to provide an MRAM for reading/writing two or more data, thereby performing an easy process.

It is the fifth object of the present invention to provide an MRAM for reading/writing two ore more data, thereby improving a sensing margin.

According to a first aspect of the present invention, a MRAM comprises: an MRAM cell having source and drain regions formed on an active region of a semiconductor substrate; an insulating layer deposited on a channel region of a semiconductor substrate; and an MTJ stacked on an upper portion of the insulating layer, wherein data is written/read to/from the MRAM cell by adjusting/sensing a current flowing through the MTJ in MRAM cell according to voltages applied to word lines of the MRAM cell.

According to a second aspect of the present invention, a MRAM comprises: an MRAM cell group consisting of a plurality of MRAM cells connected to each other in series between a bit line and a cell plate and having each gate connected to receive singal of a plurality of word lines; and a sense amplifier sensing data applied to the bit line when receiving a sense amplifier enable signal.

According to a third aspect of the present invention, a MRAM comprises: a first MRAM cell group consisting of a plurality of MRAM cells connected to each other in series between a bit line and a cell plate and having each gate connected to receive signals of a plurality of word lines; a second MRAM cell group consisting of a plurality of MRAM cells connected to each other in series between a bit line bar and a cell plate, and having each gate connected to receive signals of the plurality of word lines; and a sense amplifier connected between the bit line and the bit line bar, and for sensing data applied to the bit line and the bit line bar when receiving a sense amplifier enable signal.

According to a fourth aspect of the present invention, a MRAM comprises: a data detecting circuit connected to a bit line, and for converting a current flowing through an MTJ in an MRAM cell into a voltage and then detecting data based on the different magnetization orientation of the MTJ in the MRAM cell.

According to a fifth aspect of the present invention, a MRAM comprises an MRAM cell group consisting of a plurality of MRAM cells connected to each other in series between a bit line and a cell plate and having each gate connected to receive signals of a plurality of word lines; and a data detecting circuit connected to the bit line and, for converting a current flowing through an MTJ in the MRAM cell group into a voltage and then detecting data based on differences of magnetization orientations of the MTJ in the MRAM cell group.

According to a sixth aspect of the present invention, a MRAM comprises: a first MRAM cell group consisting of a plurality of MRAM cells connected to each other in series between a bit line and a cell plate, and having each gate connected to receive signals of a plurality of word lines; a second MRAM cell group consisting of a plurality of MRAM cells connected to each other in series between a bit line bar and a cell plate, and having each gate connected to receive signals of a plurality of word lines; and a data detecting circuit connected between the bit line and the bit line bar, and for converting currents flowing an MTJ in the first and the second MRAM cell groups into voltages and then detecting data based on differences of magnetization orientations of the MTJ in the first and the second MRAM cell groups.

BRIEF DESCRIPTION OF THE DRAWINGS

The present invention will become better understood with reference to the accompanying drawings which are given only by way of illustration and thus are not limitative of the present invention, wherein:

FIG. 22 illustrates a tale of eight data of FIG. 21.

DETAILED DESCRIPTION OF THE PREFERRED EMBODIMENTS

An MRAM in accordance with preferred embodiments of the present invention will be described in detail with reference to the accompanying drawings.

Figure 1:
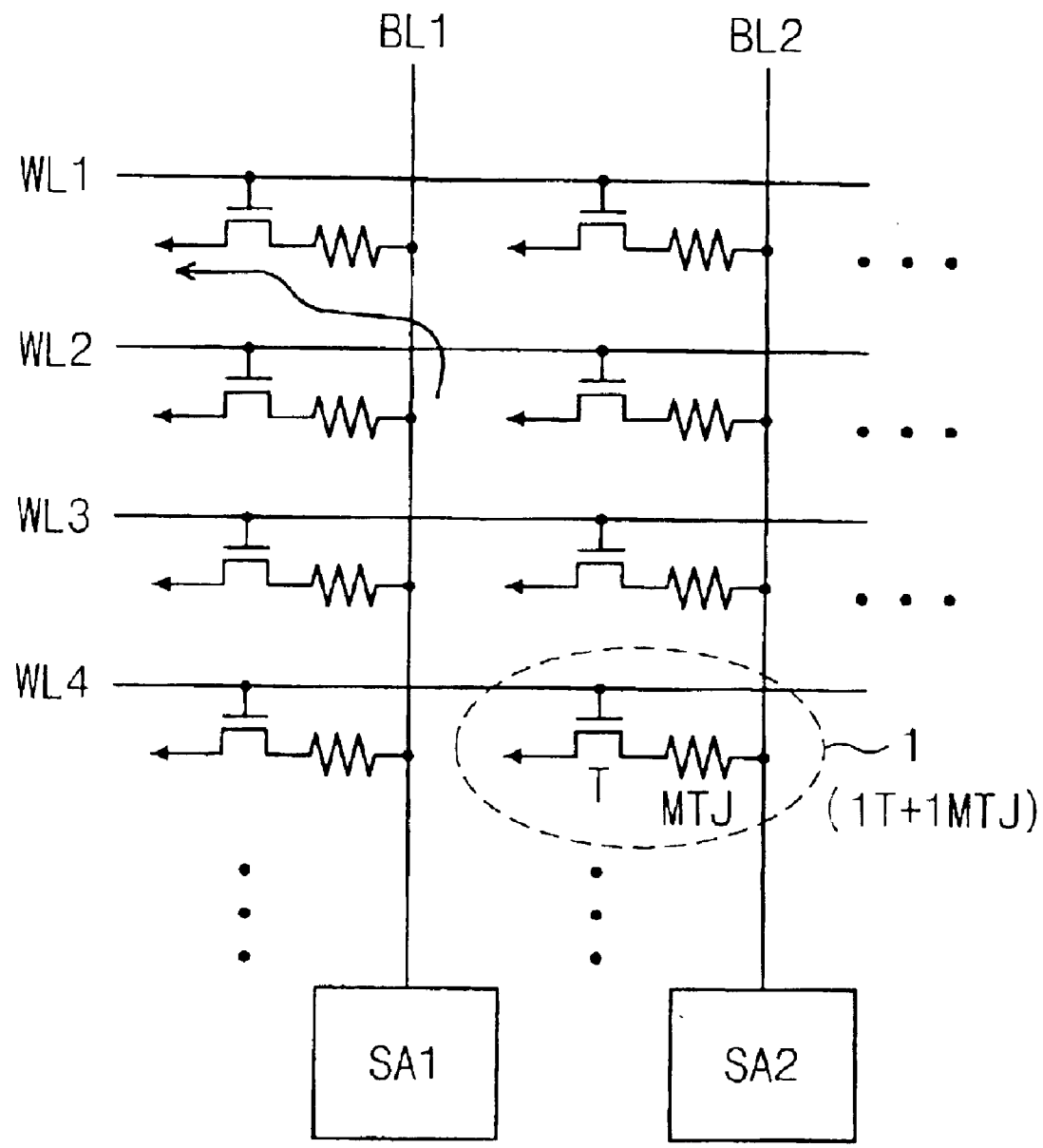
FIG. 1 illustrates a cell array of a conventional MRAM.
Figure 2A:
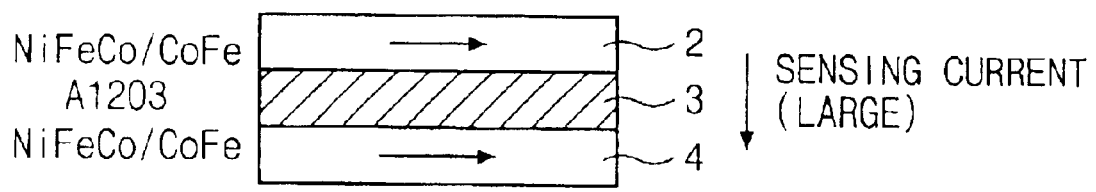
FIGS. 2a and 2b illustrate cross sectional side views of a general MTJ, respectivly.
Figure 2B:
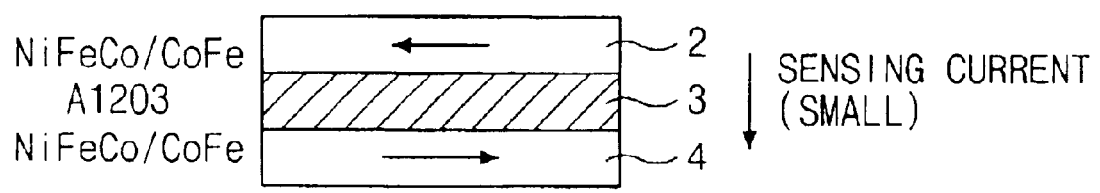
Figure 3A:
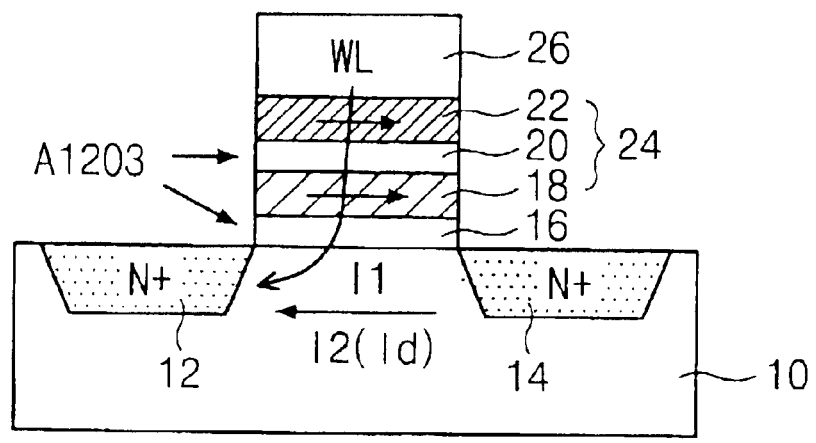
FIGS. 3a and 3b illustrate cross sectional side views of MRAM cell in accordance with the present invention, respectively.
Figure 3B:
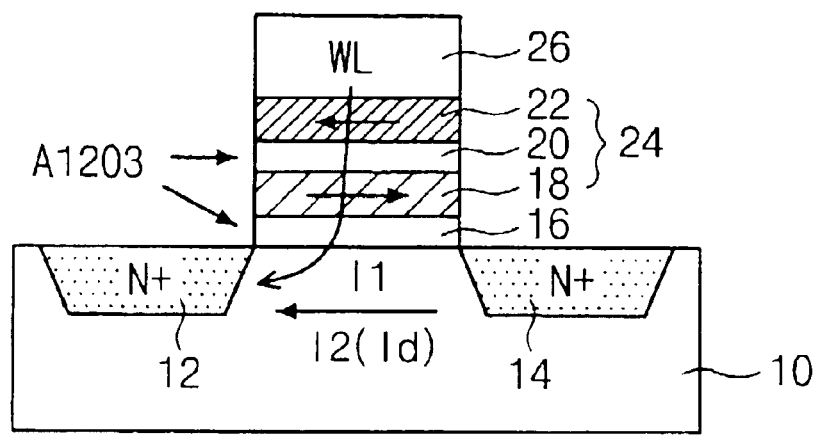

FIGS. 3a and 3b are diagrams of MRAM cells in accordance with the present invention.

MRAM cells shown in FIGS. 3a and 3b include source and drain regions 12 and 14, an insulating layer 16, an MTJ 24, and a gate metal electrode 26. The source and drains regions 12 and 14 are formed in a semiconductor substrate 10. The insulating layer 16 consisting of $Al_2O_3$ is deposited on the semiconductor substrate 10. The MTJ is deposited on the insulating layer 16, and the gate metal electrode deposited on the top of the MTJ 24 is coupled with a word line. Here, the MTJ 24 include a fixed ferromagnetic layer 18, a tunnel oxide film 20 and a free ferromagnetic layer 22.

The read operation of MRAM cells of FIGS. 3a and 3b are explained hereinafter.

An MRAM cell reads logic data of "1" or "0" according to magnetization orientations of a free ferromagnetic layer 22 of an MTJ 24. FIG. 3a shows an example of magnetization orientation for reading a logic value of "1", and FIG. 3b shows an example for reading a logic value of "0".

The read operation of an MRAM cell is performed by sensing the amount of current based on magnetization orientation of a free ferromagnetic layer 18 of an MTJ 24. If a predetermined trigger voltage is applied to a gate metal electrode 26, a tunneling current I1 flows into an MTJ 24. Here, if magnetization orientations are parallel in the fixed ferromagnetic layer 22 and the free ferromagnetic layer 18, as shown in FIG. 3a, the amount of a current I1 increases. Then, that of a current I2 flowing from a drain region 14 to a source region 12 also increases. On the contrary, if magnetization orientations are anti-parallel in the fixed ferromagnetic layer 22 and the free ferromagnetic layer 18, as shown in FIG. 3b, the amount of the current I1 decreases and then, that of the current I2 also decreases.

As a result, data stored in an MRAM cell can be sensed by setting magnetization orientation of the free ferromagnetic layer 18 parallel, anti-parallel or random, based on that of the fixed ferromagnetic layer 22.

Although the read operation of an MRAM cell are not shown, the read operation is performed by applying a predetermined voltage to the MTJ through a gate metal electrode 26 when a predetermined trigger voltage is applied in a source region 12. A magnetization orientation of a free ferromagnetic layer in an MTJ 24 is determined by a current flowing according to the volume of a voltage applied to the gate electrode 26. Logic values of "1" or "0" are written to the MRAM cell by the determined magnetization orientation.

Figure 4:
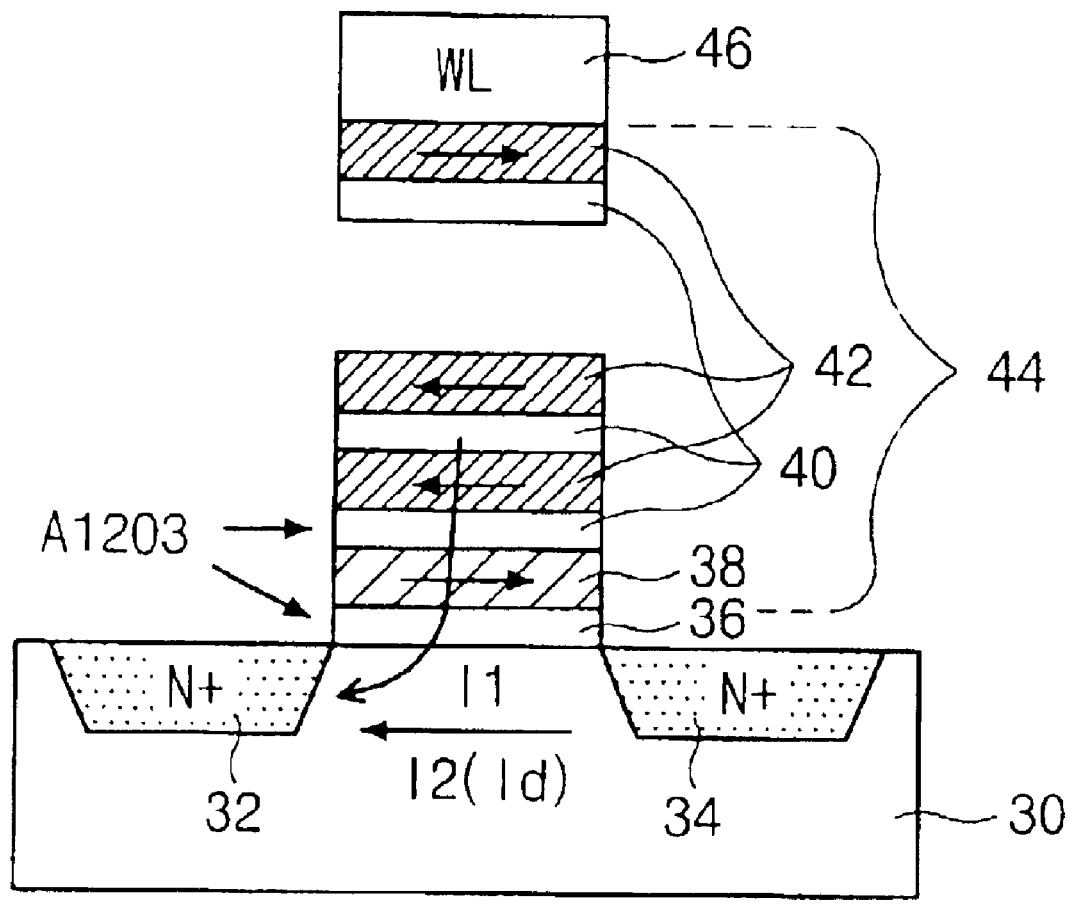
FIG. 4 illustrates a cross sectional side view of another MRAM cell in accordance with the present invention.

FIG. 4 is a diagram of a stacked-type MRAM cell in accordance with the present invention. The MRAM cell includes source and drain regions 32 and 34, an insulating layer 36, an MTJ 44, a gate metal electrode 46. The source and drain regions 32 and 34 are formed in a semiconductor substrate 30. The insulating layer 36 consists of $Al_2O_3$, and is deposited on an active region of the substrate 30. The MTJ 44 is deposited on the insulating layer 36. The gate metal electrode 46 formed on the top of the MTJ 44, and is coupled with a word line. Here, the MTJ has a stacked structure wherein a tunnel oxide film 40 and a free ferromagnetic layer 42 are repeatedly stacked on the fixed ferromagnetic layer 38. The tunnel oxide film 40 consists of $Al_2O_3$.

The read/write operation of MRAM cells shown in FIG. 4 will not be described because it is the same as the operations of MRAM cells shown in FIGS. 3a and 3b.

Figure 5:
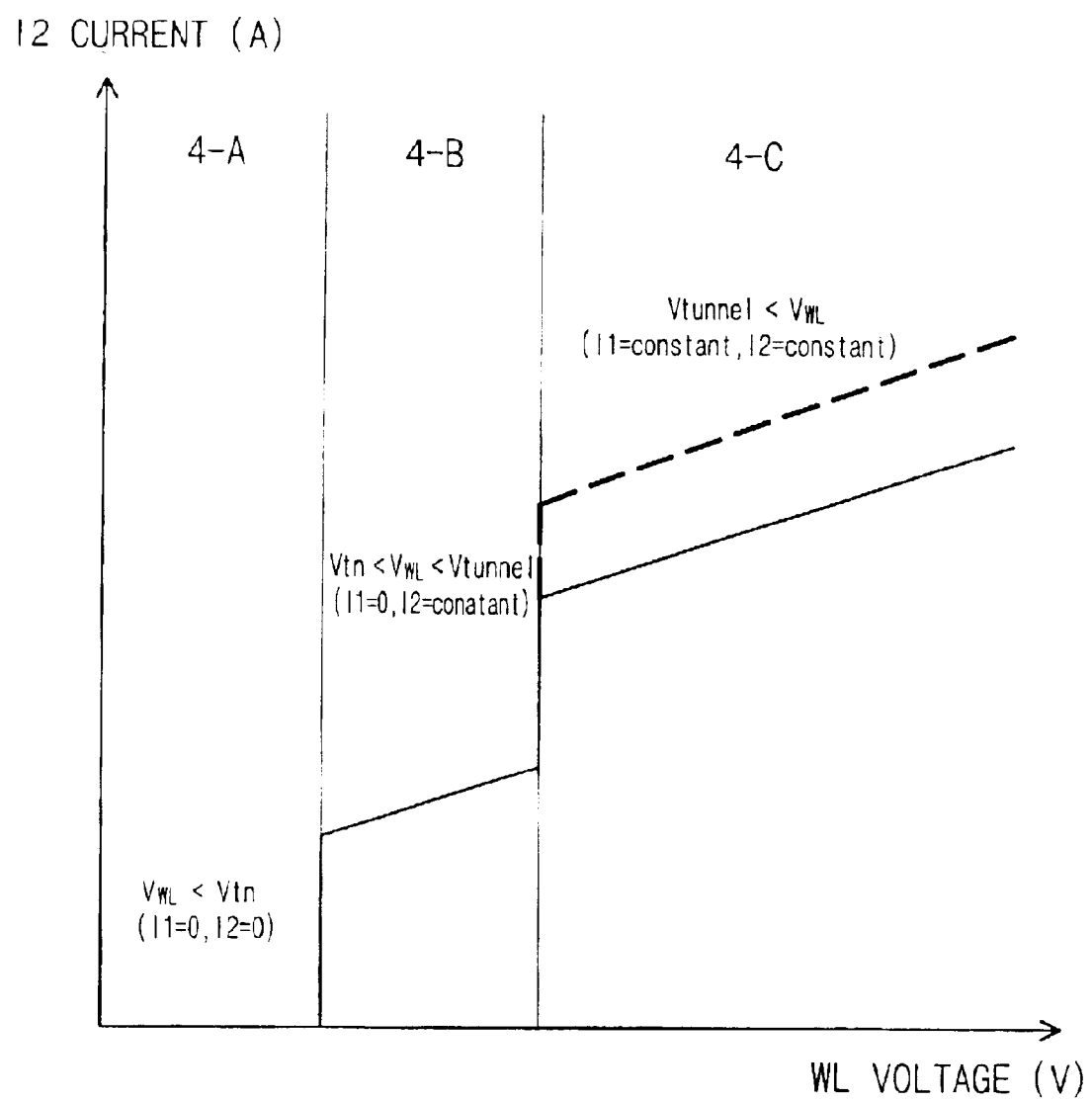
FIG. 5 illustrates a graph of an operating region of an MRAM cell in accordance with the present invention.
Figure 6A:
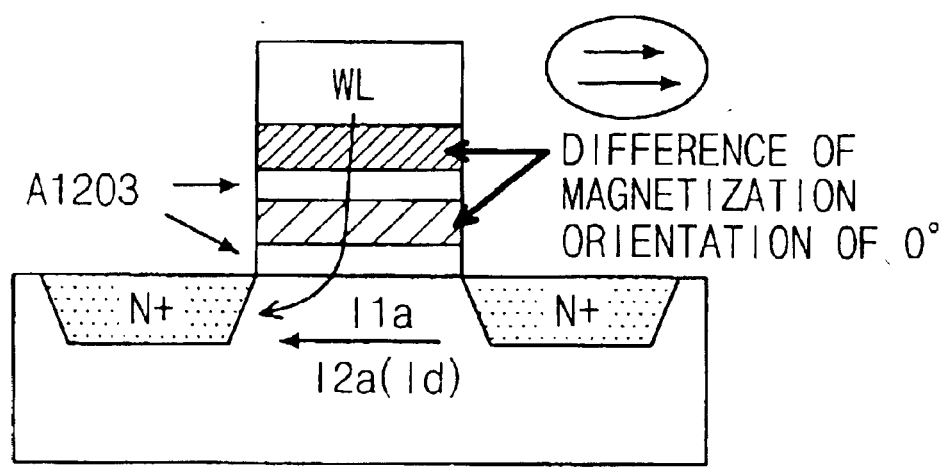
FIGS. 6a through 6d illustrate differences of magnetization orientation of MTJ in MRAM cell in accordance with the present invention, respectively.
Figure 6B:
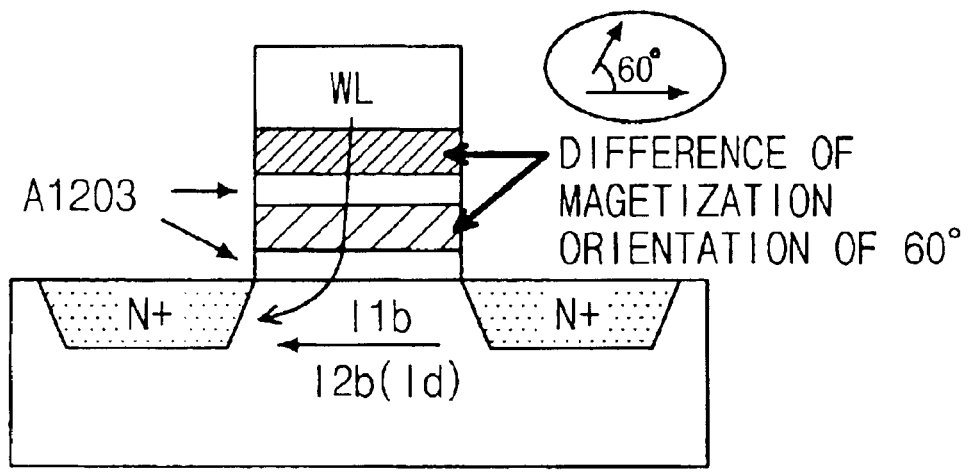
Figure 6C:
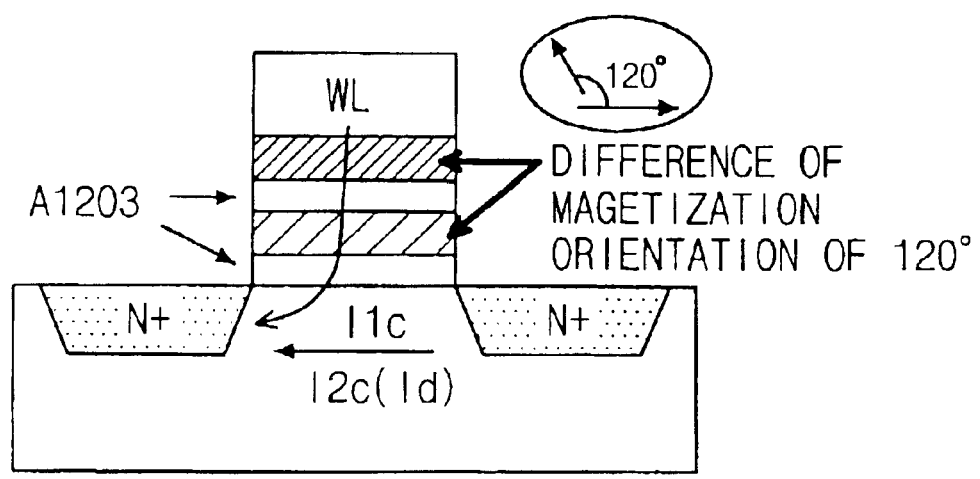
Figure 6D:
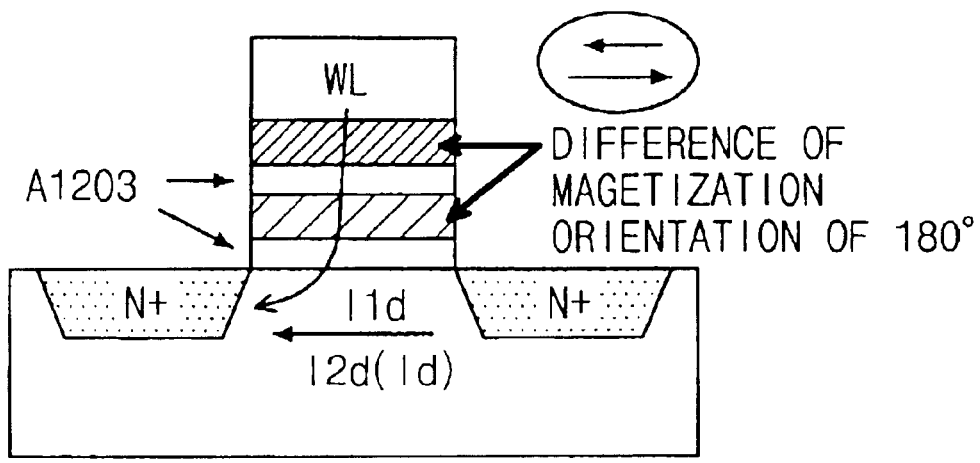

FIG. 5 is a graph illustrating changes in the amount of a current I2 according to a word line voltage of FIGS. 3a and 3b.

Here, a threshold voltage of an MRAM cell will be referred to as Vtn, a word line voltage as $V_{WL}$, a tunneling voltage, where a current I1 flows, as Vtunnel.

The operation voltage region of a word line may be divided into three regions.

In, Section 4-A a word line voltage $V_{WL}$ does not reach a threshold voltage Vtn of an MRAM cell, and thus a perpendicular current I1 and a horizontal current I2 are not generated in the channel(a logic value of "0"). A current I1 is perpendicular to a channel, and a current I2 is horizontal to a channel. As a result, currents of a word line and a bit line cannot flow into a word line and a bit line in Section 4-A.

In Section 4-B, a horizontal current I2 is generated in the channel when a word line voltage $V_{WL}$ exceeds a threshold voltage Vtn of an MRAM, while a perpendicular current I1 still is not generated (a logic value of "0") because a word line voltage $V_{WL}$ does not arrive at a tunneling voltage Vtunnel of a gate oxide film. As a result, a current of an MRAM cell is regulated only by a voltage of a gate electrode regardless of magnetization orientation of an MTJ in this section.

In Section 4-C, currents I1 and I2 are simultaneously generated in the channel when a word line voltage $V_{WL}$ exceeds a threshold voltage Vtn and a tunneling voltage Vtunnel. As a result, the amount of a current I1 is determined according to magnetization orientation of an MTJ 15, and a current corresponding to data stored in an MRAM cell is applied to a bit line by regulating the amount of a current I2 according to a current I1.

FIGS. 6a through 6d illustrate MRAM cells wherein magnetization orientation of an MTJ is divided into four steps.

As shown in FIGS. 6a through 6d, when differences of magnetization orientations of 0°, 60°, 120° and 180° in MTJs are detected by sensing currents I2a, I2b, I2c and I2d, four data are read from an MRAM cell.

Figure 7A:
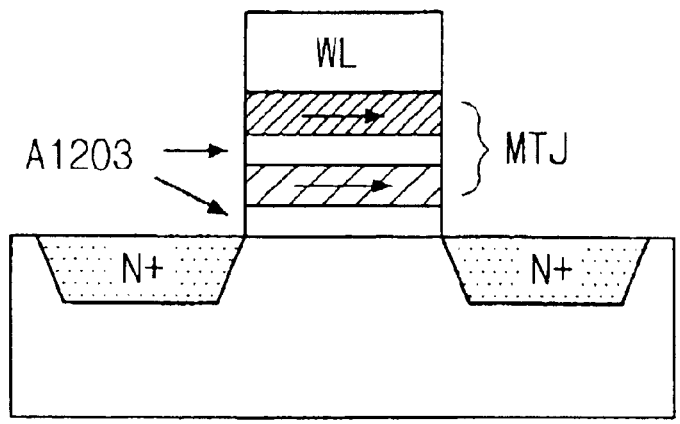
FIGS. 7a through 7c illustrate an operating region of an MRAM cell respectively shown in FIGS. 6a through 6d.
Figure 7B:
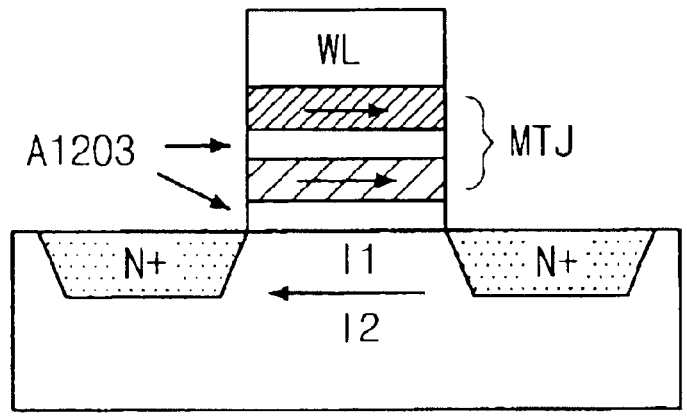
Figure 7C:
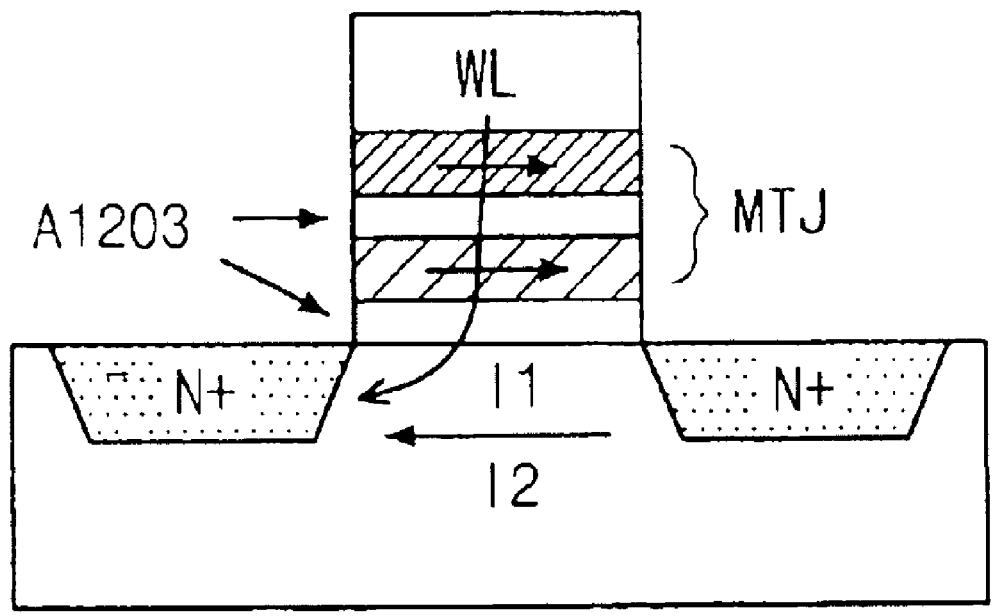
Figure 8:
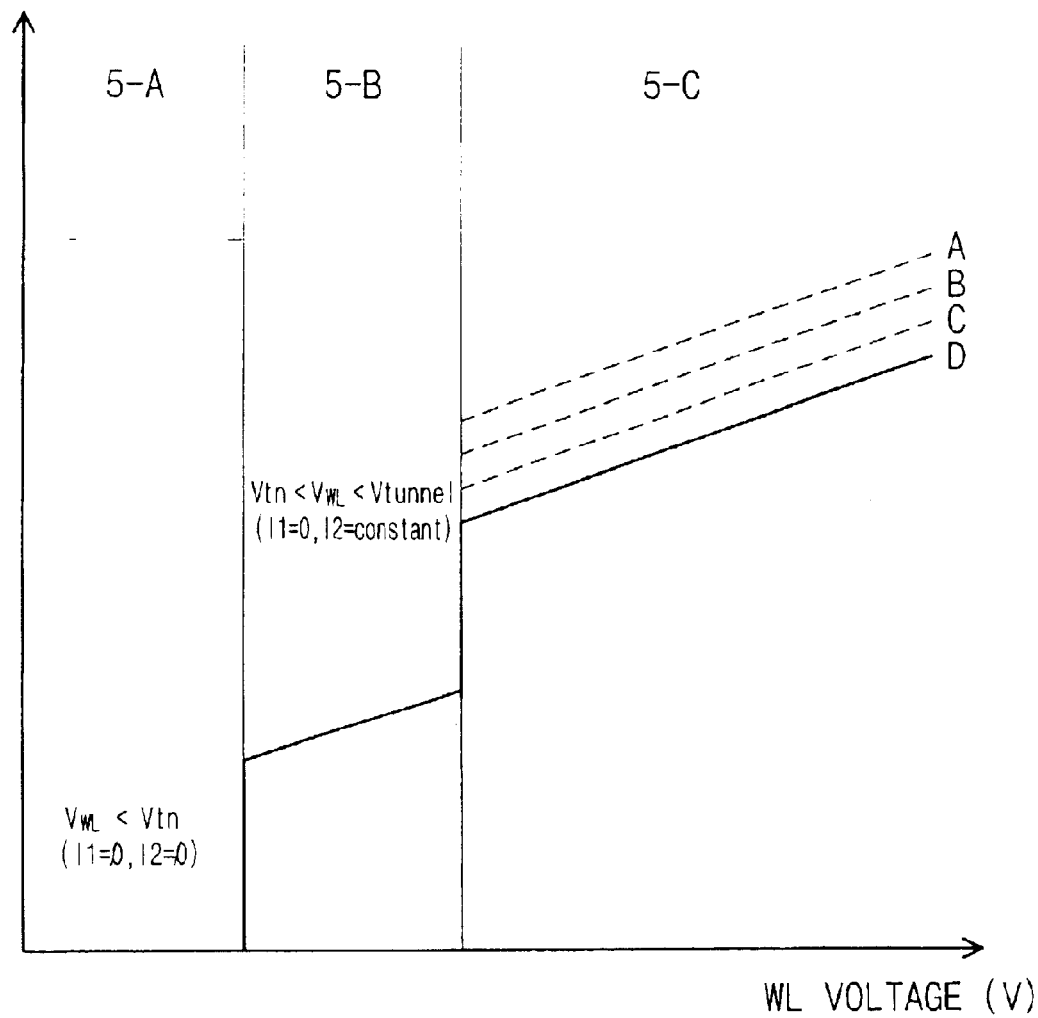
FIG. 8 illustrates a graph of an operating region in an MRAM cell shown in FIGS. 7a through 7c.

FIGS. 7a through 7c illustrate operation regions of MRAM cells in accordance with the present invention; and FIG. 8 is a graph illustrating an operation region according to a voltage applied to a word line WL of an MRAM cell in accordance with the present invention.

Hereinafter, the change of a current I2 according to the voltage applied to a word line of an MRAM cell will be explained with reference to FIGS. 7a through 8.

Here, a threshold voltage of an MRAM cell will be referred to as Vtn, a word line voltage as $V_{WL}$, and a tunneling voltage, wherein a current I1 flows, as Vtunnel.

The operation region according to a word line voltage $V_{WL}$ may be divided into three regions.

In Section 5-A of FIGS. 7a through 8, a word line voltage $V_{WL}$ does not reach a threshold voltage Vtn of an MRAM cell, and thus a perpendicular current I1 and a horizontal current I2 are not generated in a channel (logic value of "0"). As a result, currents of a word line and a bit line cannot flow into a word line and a bit line in Section 4-A.

In Section 5-B of FIGS. 7a through 8, a current I2 is generated when a word line voltage $V_{WL}$ exceeds a threshold voltage Vtn of an MRAM, while a current I1 is not generated in the channel (a logic value of "0") because a word line voltage $V_{WL}$ does not arrive at a tunneling voltage Vtunnel of a gate oxide film. As a result, a current of an MRAM cell is regulated only by a voltage of a gate electrode regardless of magnetization orientation of an MTJ in this section.

In Section 5-C, currents I1 and I2 are simultaneously generated in the channel when a word line voltage $V_{WL}$ exceeds a threshold voltage Vtn and a tunneling voltage Vtunnel. The relative differences of magnetization orientation are generated according to the differences of voltage applied to a gate metal electrode in this section. The relative differences are divided into four steps A, B, C and D.

The relative difference of magnetization orientation is not generated in the step A. Large differences of magnetization orientation are generated in the steps B, C, and D, thereby resulting in the highest value of resistance in the step D and the lowest value of resistance in the step A.

In Section 5-C of FIG. 8, the amount of a current I1 and I2 are determined according to magnetization orientation of an MTJ. As a result, the amount of a current corresponding to data stored in an MRAM cell is applied to a bit line in this section.

Figure 9:
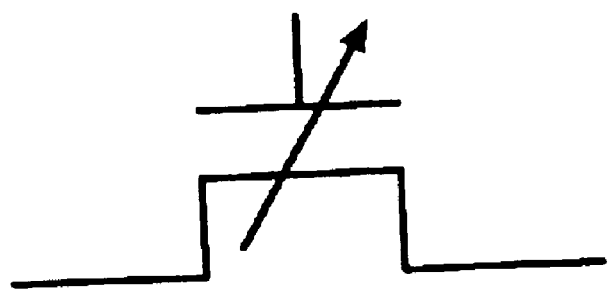
FIG. 9 illustrates a symbol of an MRAM cell in accordance with the present invention.

FIG. 9 is a diagram representing an MRAM cell by a symbol. Hereinafter, an MRAM cell of the present invention will be showed as a symbol in FIG. 9.

FIGS. 10 through 13 illustrate examples of MRAM cell arrays in accordance with the present invention.

Figure 10:
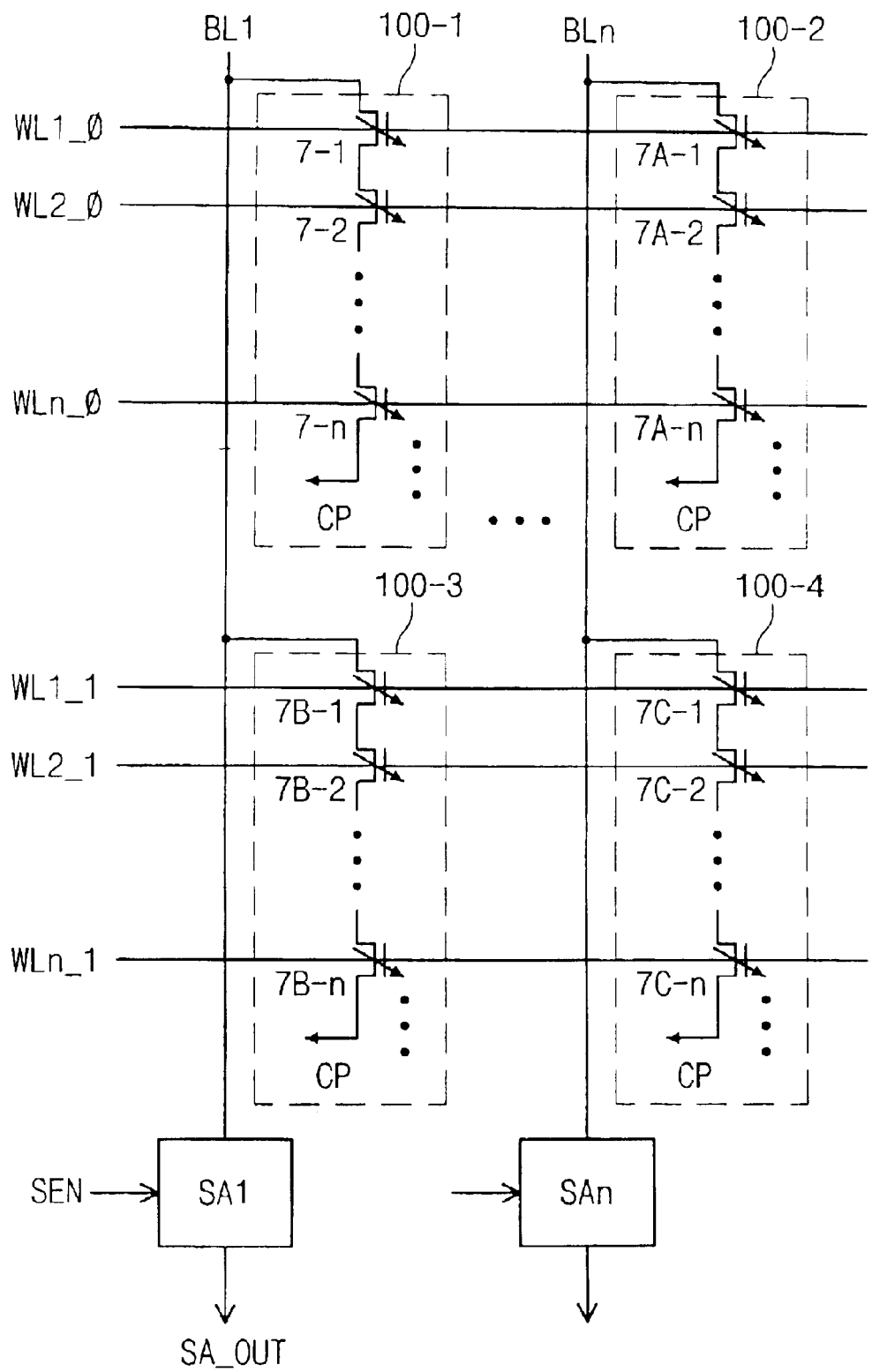
FIGS. 10 through 13 illustrate MRAM cell array in accordance with the present invention respectively.

FIG. 10 illustrate an array of NAND-MRAM cells in accordance with the present invention.

A cell array of an MRAM shown in FIG. 10 includes an MRAM cell group connected to a bit line and a word line and a sense amplifier connected to the bit line. This sense amplifier outputs a data signal SA_OUT amplified according to input of a sense amplifier enable signal SEN.

Here, an MRAM cell group includes n MRAM connected in series. The n MRAM cells also have one terminal coupled with bit lines BL (including BL1 ... BLn) and other terminal coupled with cell plates CP.

In other words, n MRAM cell groups 110-1~100-4 include MRAM cells 7-1, 7A-1, 7B-1 and 7C-1 having each drain connected to bit lines BL, and MRAM cells 7-n, 7A-n, 7B-n and 7C-n having each source connected to cell plates CP, respectively. A bit line BL is then coupled with a plurality of MRAM cells. MRAM cell groups 100-1~100-4 include MRAM cells having each gate connected to word lines WL(WL1_0~WLn_0, WL1_1~WLn_1). Word lines WL1_0~WLn_0 are connected to MRAM cells 7-1~7-n in a MRAM cell group 100-1 and MRAM cells 7A-1~7A-n in a MRAM cell group 100-2. In the same way, word lines WL1-1~WLn_1 are connected in common to MRAM cells 7B-1~7B-n in an MRAM cell group 100-3 and MRAM cells 7C-1~7C-n in a MRAM cell group 100-4.

Figure 11:
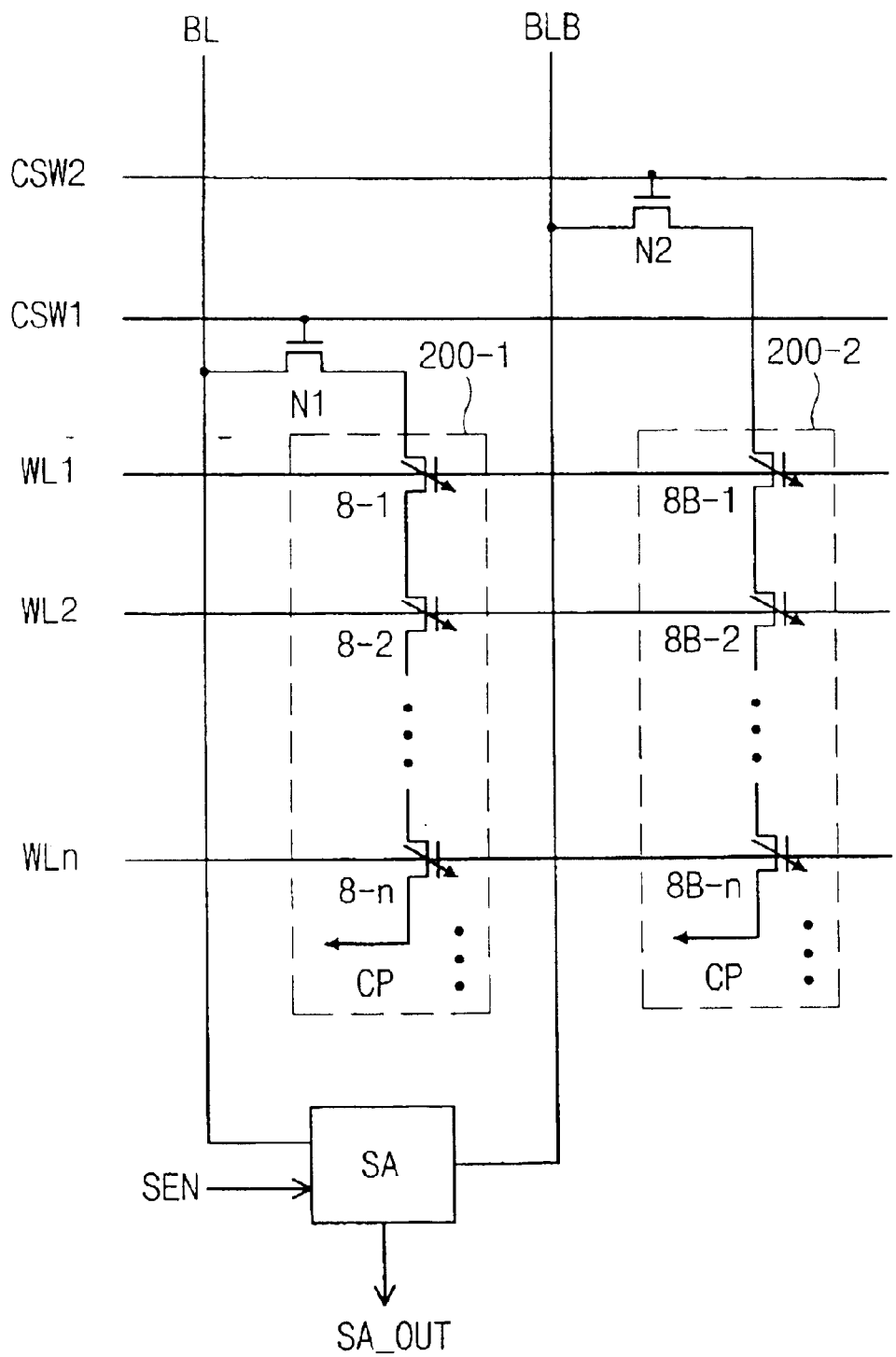

FIG. 11 illustrates an NAND-MRAM folded bit line cell array in accordance with the present invention.

An MRAM of FIG. 11 includes two MRAM cell groups and a sense amplifier. The MRAM cell groups are connected to word lines, bit lines or bit line bars, and receive switching contro signals. A sense amplifier is connected in common to bit line and bit line bar.

The MRAM cell groups 200-1 and 200-2 have MRAM cells connected to each other in forms of an NAND. The MRAM cell groups have also switching transistors N1 and N2 connected to a bit line BL and a bit line bar BLB, respectively. MRAM cells 8-1~8-n in the MRAM cell group 200-1 are connected between one terminal of a switching transistor N1 and a cell plate CP. In the same way, MRAM cells 8B-1~8B-n are connected between one terminal of a switching transistor N2 and a cell plate CP. Switching control signals CSW1 and CSW2 are respectively applied to gates of switching transistors N1 and N2. Word lines WL1~WLn are connected in common to gates of MRAM cells connected to the same bit line BL and the Bit line bar BLB.

Figure 12:
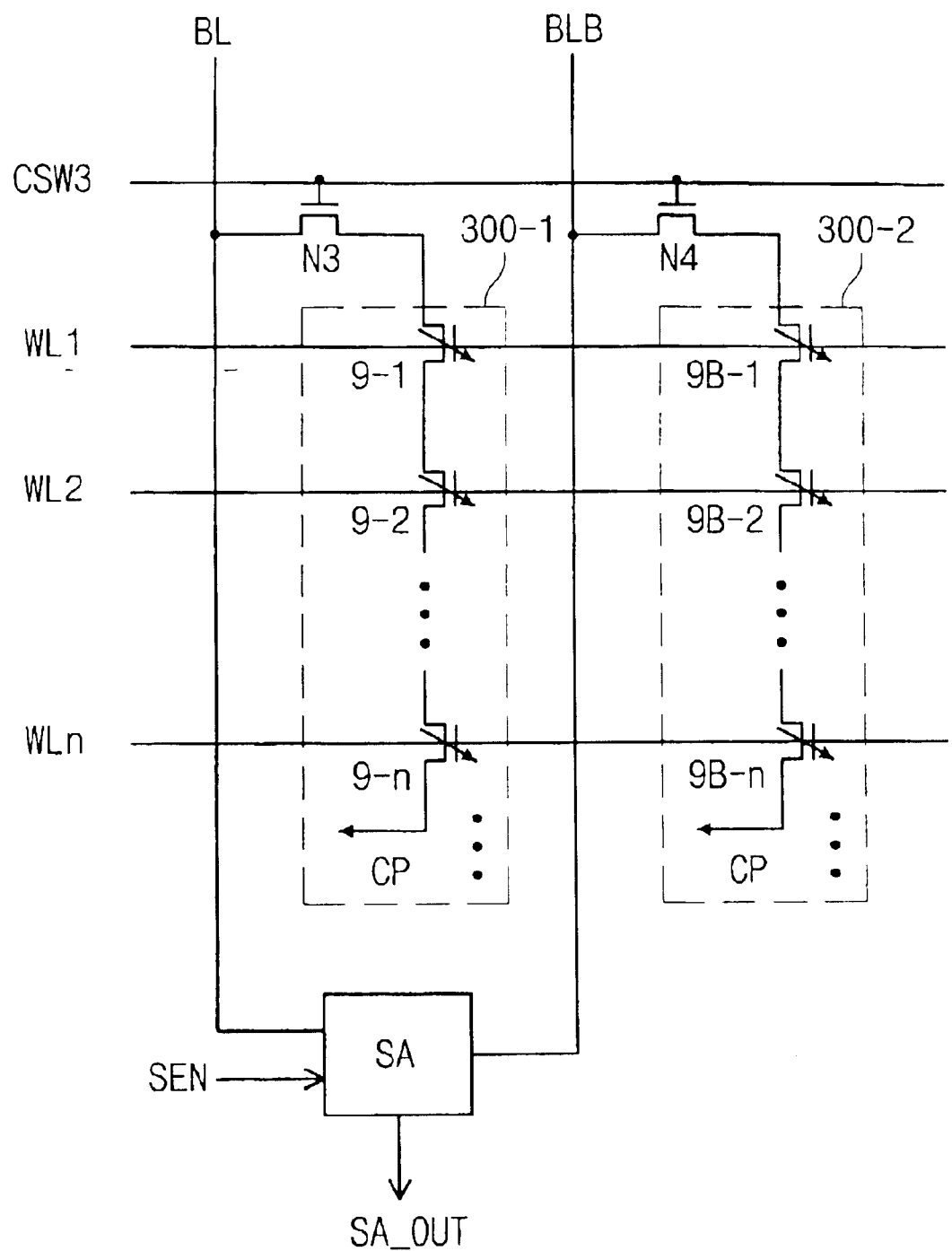

FIG. 12 illustrates an array of 2NAND-MRAM cells in accordance with the present invention.

An MRAM of FIG. 12 will not be described here because it has the same structure of the MRAM in FIG. 11, except that a switching control signal CSW3 is applied to each gate of switching transistors N3 and N4.

Figure 13:
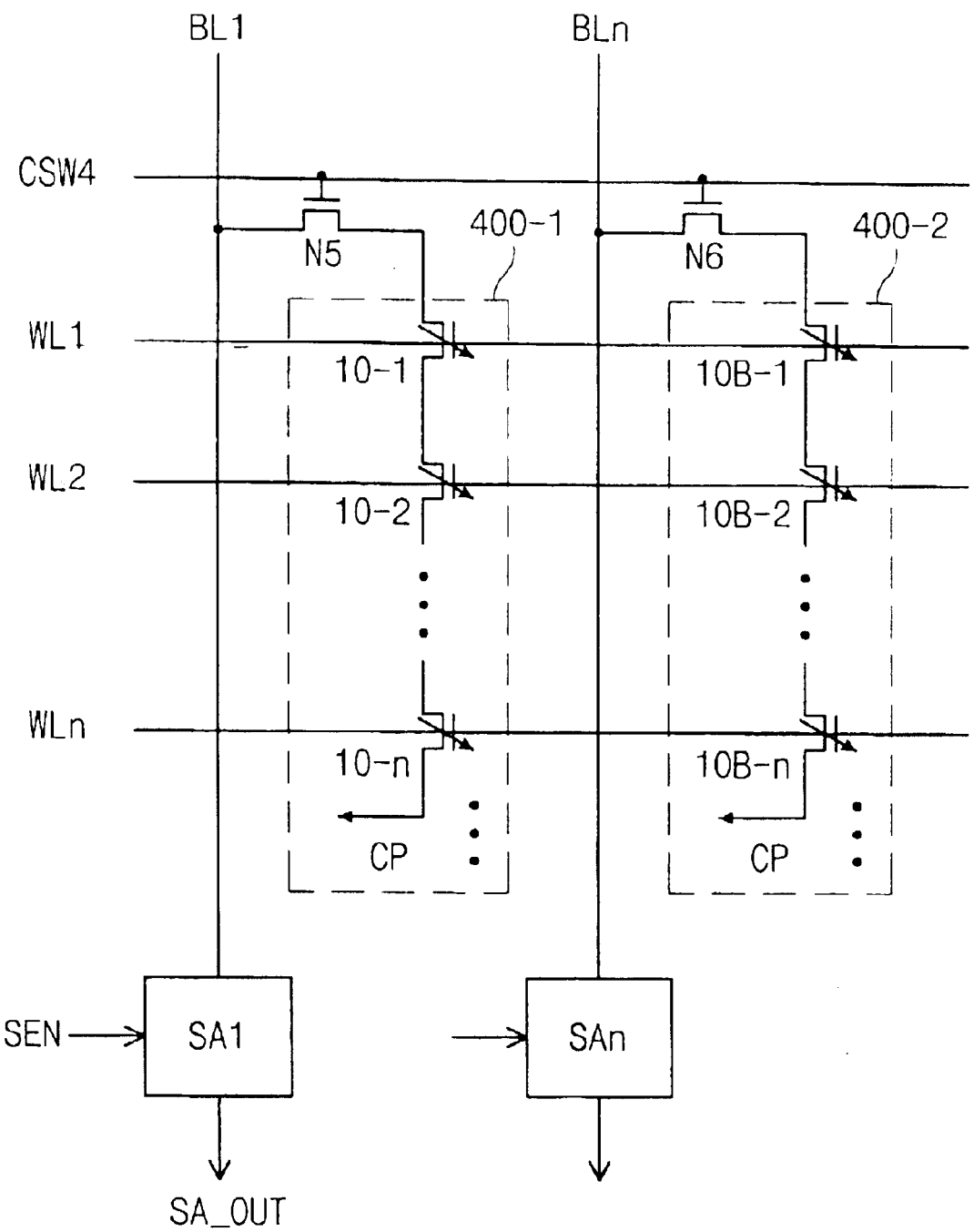

FIG. 13 illustrates an array of switching control NAND-MRAM cells.

A MRAM of FIG. 13 comprises MRAM cell groups and a sense amplifier. The MRAM cell groups are connected to, word lines and bit lines, and receive switching control signal. The sense amplifier is connected to a bit line.

The MRAM cell groups 400-1 and 400-2 have MRAM cells connected to each other in forms of an NAND. The MRAM cell groups have also switching transistors N5 and N6 connected to a bit line BL and a bit line bar BLB, respectively. MRAM cells 10-1~10-n in the MRAM cell group 200-1 are connected between one terminal of a switching transistor N5 and a cell plate CP. In the same way, MRAM cells 10B-1~10B-n are connected between one terminal of a switching transistor N6 and a cell plate CP. A switching control signal CSW4 is respectively applied to gates of switching transistors N5 and N6. Word lines WL1~WLn are connected in common to gates of MRAM cells connected to bit lines BL~BLn.

Figure 14:
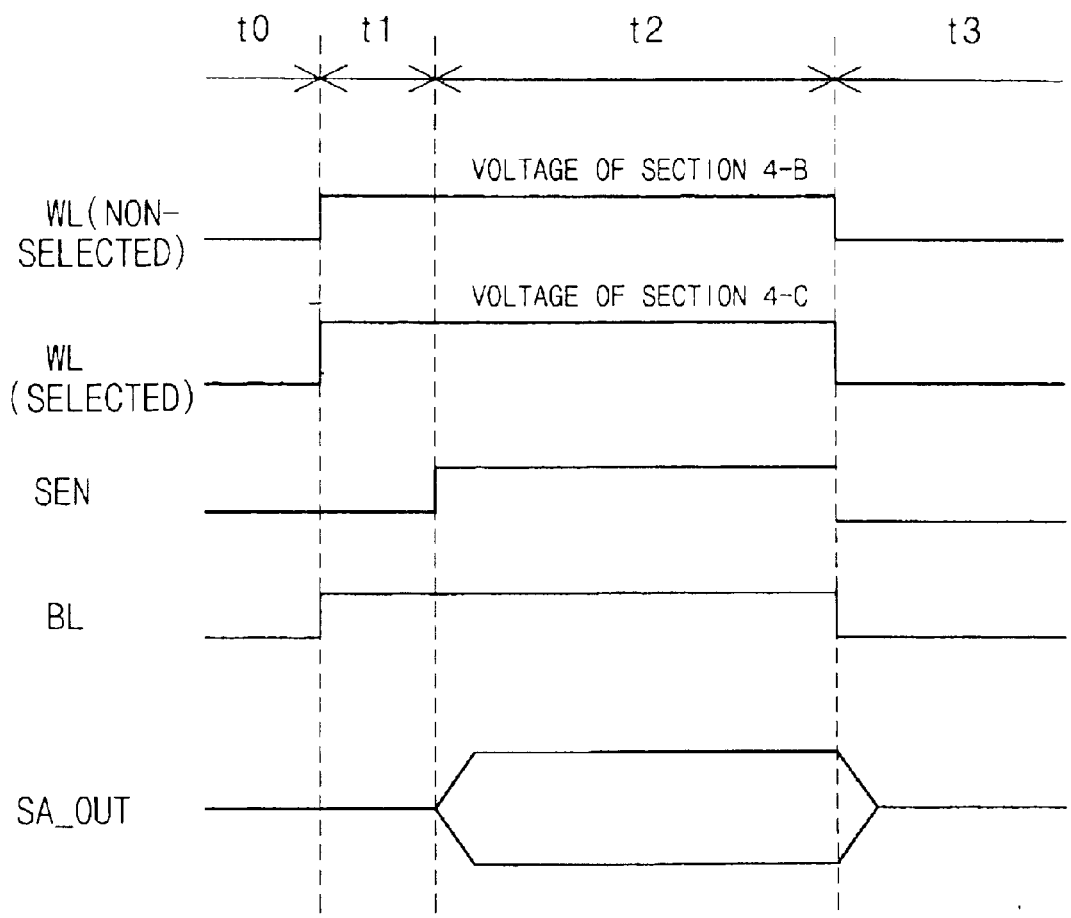
FIG. 14 illustrates a timing diagram during the write operation of an MRAM cell array in accordance with the present invention.

FIG. 14 is a timing diagram during the write operation of an MRAM cell array as described above.

The write operation of an MRAM cell array will be explained, based on the operation of an MRAM cell shown in FIG. 10.

This read operation is divided into an initial section t0, a memory cell selecting section t1, a sense amplifier enable section t2 and a read terminating section t3.

In the initial section t0, bit lines and word lines maintain low level voltage which does not read data, and a sense amplifier is disabled.

In the memory selecting section t1, a large word line voltage is applied to a word line WL selected to read data stored in a MRAM cell so that a read operation can be performed in Section 4-C of FIG. 5. A small word line voltage is applied to a non-selected word line so that a read operation can be performed in Section 4-B of FIG. 5. Here, currents I1 and I2 are both generated in a selected word line because a large word line voltage is applied to a selected word line. As a result, data stored in an MRAM cell can be read according to magnetization orientation of an MTJ. Data in an MRAM connected to a selected word line is then applied to a bit line, and data in a selected MRAM cell is outputted to a sense amplifier connected to a bit line BL. The current corresponding to data in an MRAM cell is outputted to a bit line BL. When a current enough to sense is outputted to a bit line BL, the sense amplifier enable section t2 is entered.

In the sense amplifier enable section t2, when a sense amplifier enable signal SEN is applied to a sense amplifier SA at a predetermined level, the sense amplifier SA senses data applied to a bit line BL and then outputs sensed data SA_OUT. The sense amplifier senses a plurality of data according to the current supplied to a bit line. A sense amplifier enable signal SEN is applied to the sense amplifier SA. When the predetermined output time is exceeded, a terminating section t3 is entered.

In the terminating section t3, a signal for selecting a word line WL and a bit line BL, and a signal SEN for enabling a sense amplifier return to the initial section t0. As a result, a current corresponding to data stored in an MRAM cell is not outputted to a bit line BL, and a sensed data SA_OUT is not outputted, either.

Here, data contrary to data applied to a bit line is applied to an MRAM cell connected to a bit line bar BLB shown in FIGS. 11 and 12. A current having a value contrary to logic data applied to a bit line flows in a bit line bar BLB. A sense amplifier senses data according to a current flowing in a bit line bar BLB.

Figure 15:
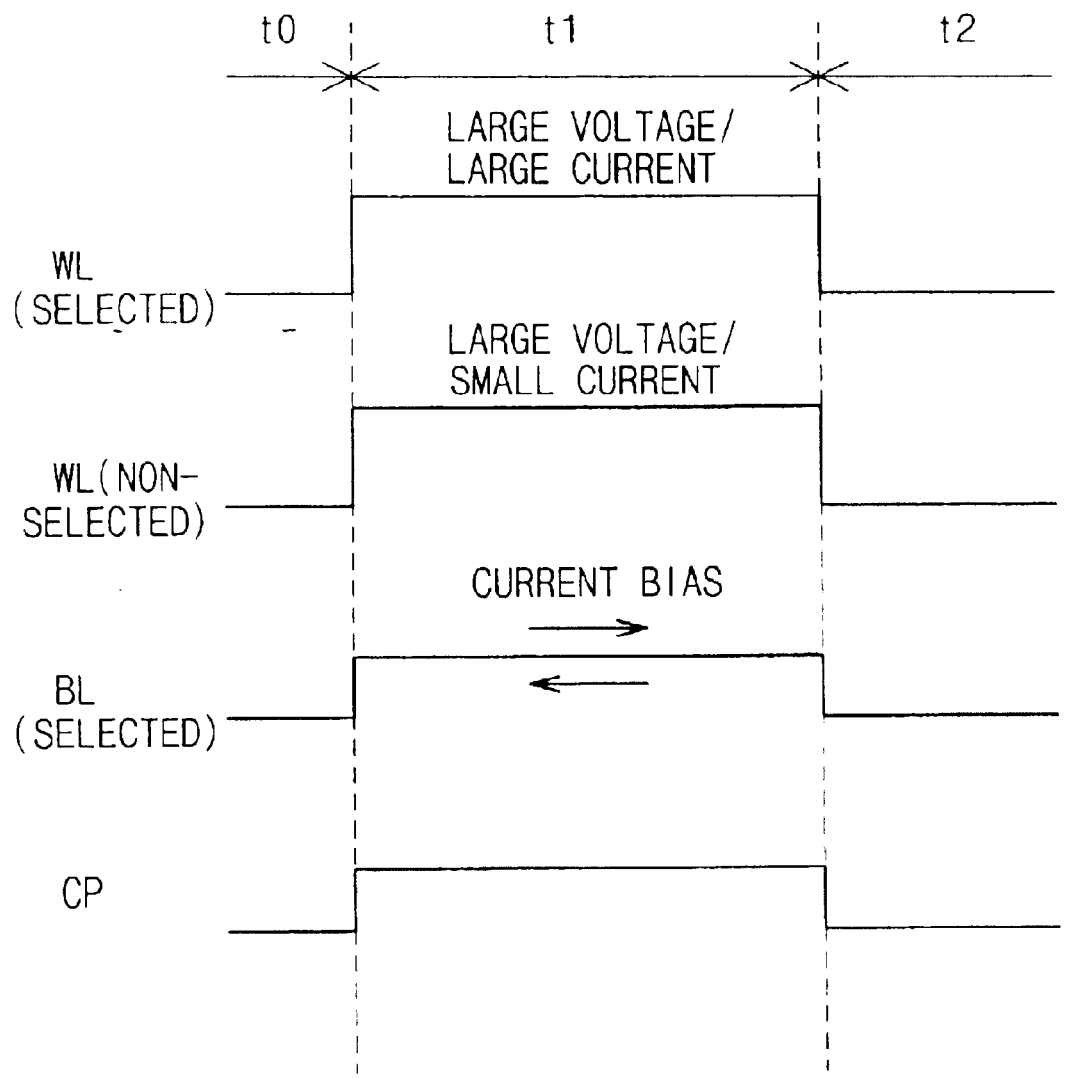
FIG. 15 illustrates a timing diagram during the read operation of an MRAM cell array in accordance with the present invention.

FIG. 15 is a timing diagram during the read operation of an MRAM cell array in accordance with the present invention.

This write operation is divided into an initial section t0, a write section t1 and a write terminating section t2.

In the initial section t0, a ground voltage is simultaneously applied to a selected word line WL and an non-selected word line WL. While the write section t1 is entered, a voltage for generating a predetermined current is applied to a selected word line WL.

In the write section t1, a large word line voltage is applied to a selected word line WL so that a bit line current and a word line current enough to write can flow therein. A large bit line current is applied to an non-selected word line WL so that a word line current required to write cannot flow therein. When a write voltage is applied to a bit line BL, a magnetization orientation of a free ferromagnetic layer is determined by the direction of a current flowing between a cell plate CP and a bit line BL. Data is written in an MRAM cell according to the magnetization orientation of an MTJ. In this way, time for writing data in an MRAM cell is secured in the write section t1, and thereafter, a ground voltage is applied to a word line in a write terminating section t2.

Figure 16:
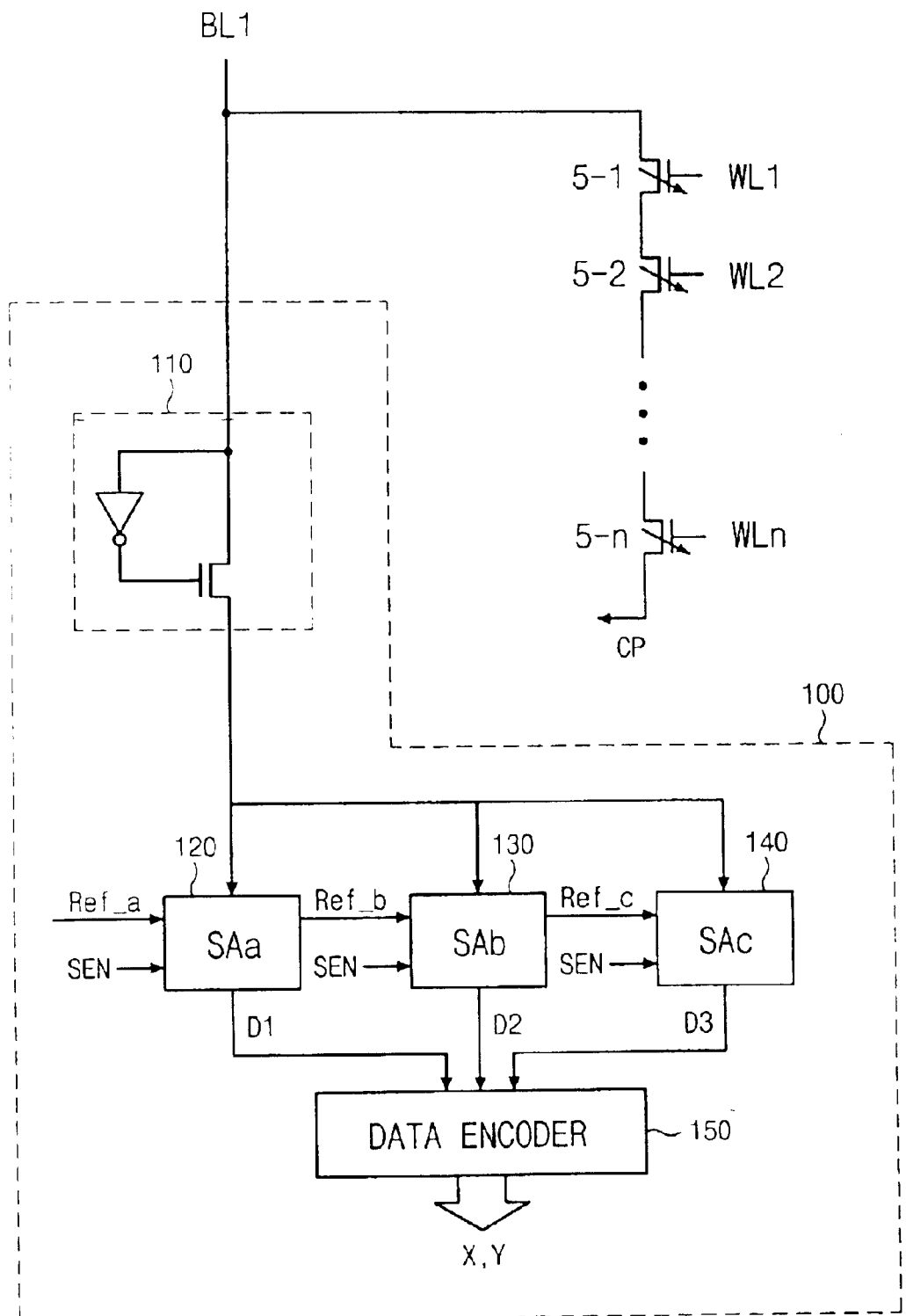
FIG. 16 illustrates a data detecting circuit for detecting the level of four data in accordance with the present invention.

FIG. 16 illustrates a data detecting circuit for detecting the level of four data in accordance with the present invention.

An MRAM of FIG. 16 has a plurality of MRAM cells connected in series to each other between a bit line BL1 and a cell plate CP, and having each gate connected to receive signals of word lines WL1~WLn. The MRAM includes data detecting circuit 100 connected to a bit line BL1.

The data detecting circuit 100 includes a current-voltage converter 110 connected to a bit line BL1, sense amplifiers 120, 130 and 140 connected to the current-voltage converter 110, and a data encoder 150 connected to the sense amplifiers 120, 130 and 140.

An MRAM cell 5-1 has its drain connected to a bit line BL1 and its source connected to a drain of an MRAM cell 5-2. In this way, n MRAM cells 5-1~5-n are connected in series to each other. A final MRAM cell 5-n has its source connected to a cell plate CP. MRAM cells 5-1~5-n have each gate connected to receive signals of word lines WL1~WLn, respectively.

A current-voltage converter 110 connected to a bit line BL1 converts a current flowing in MRAM cells 5-1~5-n into a voltage, and then detects data according to the differences of magnetization orientation of an MTJ in the MRAM cell. The current-voltage converter 100 transmits the detected data to sense amplifiers 120, 130 and 140 having different reference levels Ref_a, Ref_b and Ref_c.

The sense amplifiers 120, 130 and 140 generate data D1, D2 and D3 according to reference levels Ref_a, Ref_b and Ref_c, using data according to magnetization orientation, and then transmit the data D1, D2 and D3 to a data encoder 150.

The data encoder 150 encodes the data D1, D2 and D3 transmitted from the sense amplifiers 120, 130 and 140, and then outputs 2 bit data.

Hereinafter, the process of generating 2 bit data in the data encoder 150 will be explained with reference to FIGS. 17 through 19.

Figures 17, 18:
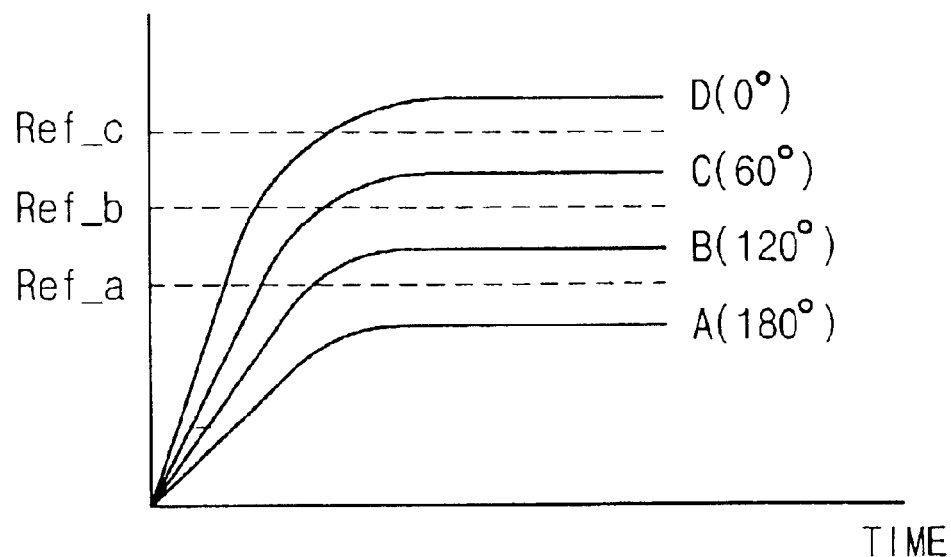
FIG. 17 illustrates a graph of four data and reference voltages of FIG. 16.
FIG. 18 illustrates a table of four data of FIG. 17.

FIG. 17 is a graph illustrating the relations between reference voltages Ref_a, Ref_b and Ref_c, and four data A, B, C and D according to the difference of magnetization orientation of an MTJ.

FIG. 18 is a table illustrating values of three data D1, D2 and D3 according to reference voltage Ref_a, Ref_b, Ref_c, and values of 2 bit data of X and Y generated from encoding data D1, D2 and D3.

Figure 19:
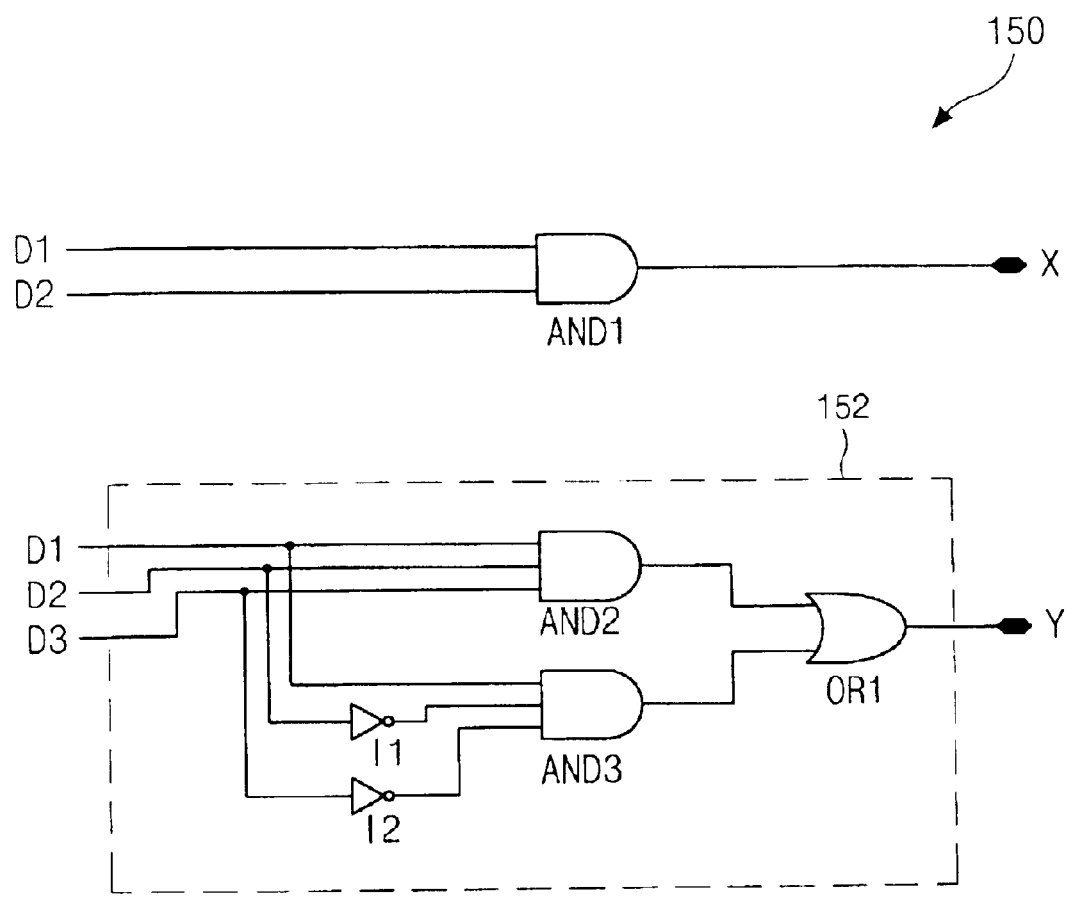
FIG. 19 illustrates a circuit diagram of a data encoder for making table values of FIG. 18.

FIG. 19 is a circuit diagram of a data encoder 150 for encoding data D1, D2 and D3 and generating 2 bit data X and Y.

The data encoder 150 includes an AND gate AND1 and a logic circuit 152. The AND gate AND1 logically combines data D1 and D2, and outputs data X. The logic circuit 152 logically combines data D1, D2 and D3, and outputs data Y.

The logic circuit 152 includes an AND gate AND2, inverters I1 and I2, an AND gate AND3 and an OR gate OR1. The AND gate AND2 AND-combines data D1, D2 and D3. The inverters I1 and I2 inverts data D2 and D3. The AND gate AND3 AND-combines output signals of inverters I1 and I2. The OR gate OR1 OR-combines output signals of AND gates AND2 and AND3, and outputs data Y.

A table of FIG. 18 exactly shows the values of 2 bit data X and Y outputted from the data encoder 150 shown in FIG. 19.

A data detecting circuit for detecting an MRAM cell array and eight data levels will be explained with reference to FIG. 20.

Figure 20:
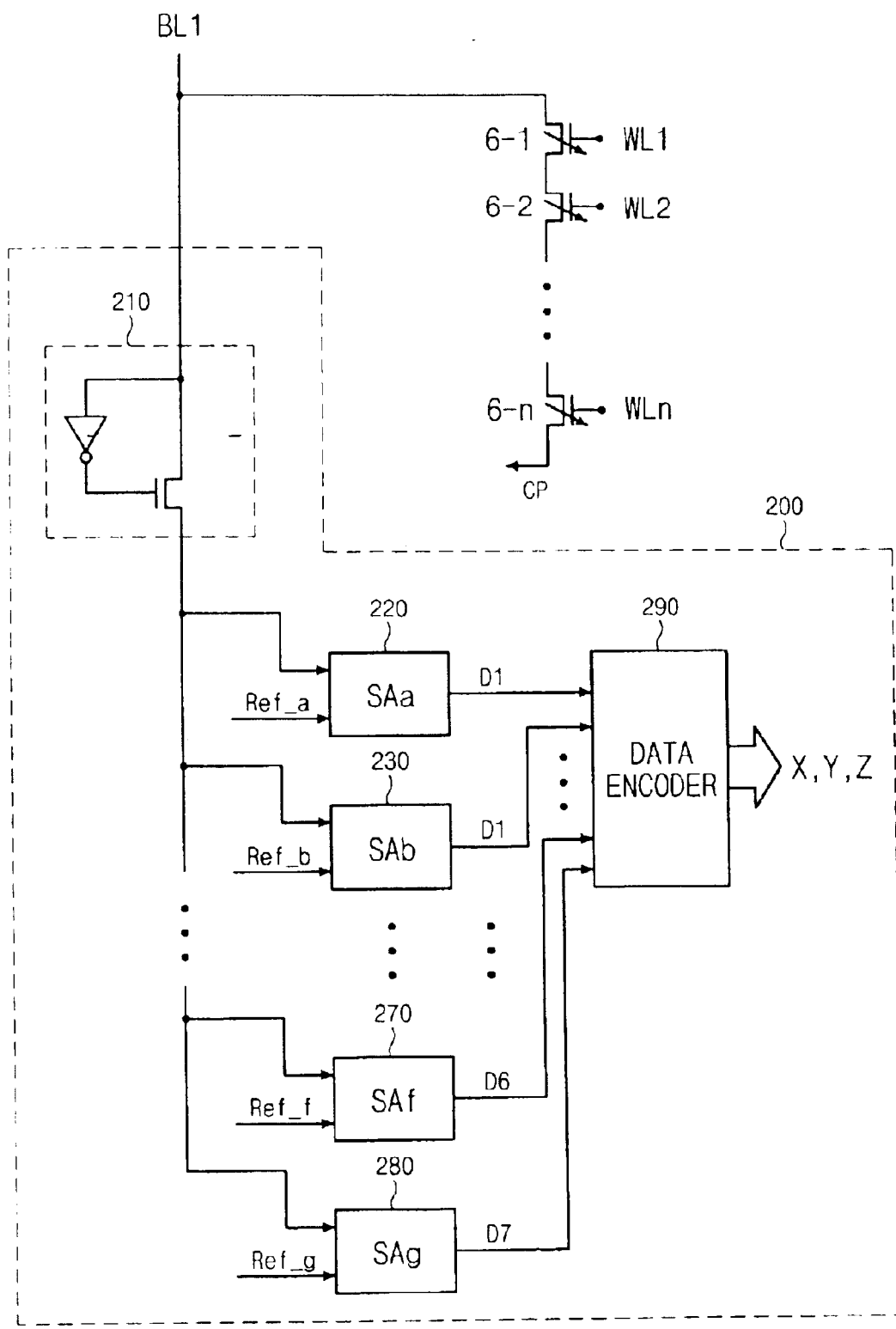
FIG. 20 illustrates a data detecting circuit for detecting the level of eight data in accordance with the present invention.

FIG. 20 has the same structure of FIG. 16, except that a data detecting circuit 200 detects eight data levels.

The data detecting circuit 200 includes a current-voltage converter 210 connected to a bit line BL1, seven sense amplifiers 220~280 connected to the current-voltage converter 210, and a data encoder 290 connected to the seven sense amplifiers 220-280.

The current-voltage converter 210 converts a current flowing in an MRAM cell into a voltage, and detects data A, B, C, D, E, F and G according to magnetization orientation of an MTJ in the MRAM cell. The current-voltage converter 210 then transmits the detected data to sense amplifiers 220~280 having different reference voltages Ref_a~Ref_g.

The sense amplifiers 220~280 generate data D1, D2, D3, D4, D5, D6 and D7 according to reference levels Ref_a~Ref_g, using data resulted from magnetization orientation transmitted from the current-voltage converter 210. The sense amplifiers 220~280 then transmits the data D1, D2, D3, D4, D5, D6 and D7 to a data encoder 290.

The data encoder 290 encodes the data D1, D2, D3, D5, D6 and D7 transmitted from the sense amplifiers 220~280, and outputs 3 bit data.

Hereinafter, the process of generating 3 bit data in the data encoder 290 will be explained with reference to FIGS. 21 through 23.

Figure 21:
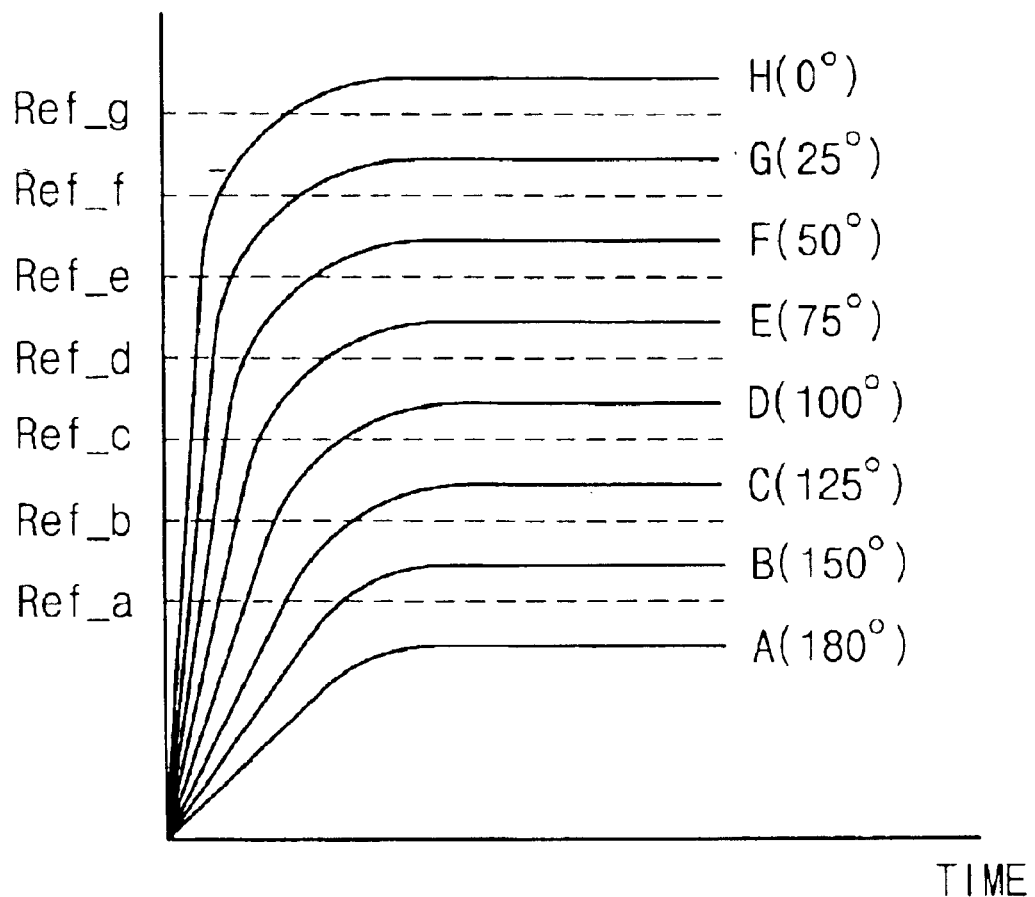
FIG. 21 illustrates a graph of eight data and reference voltages.

FIG. 21 is a graph illustrating the relation between eight data A, B, C, D, E, F, G and H according to magnetization orientation of an MTJ and reference voltages Ref_a, Ref_b, Ref_c, Ref_d, Ref_e, Ref_f and Ref_g for detecting the data.

FIG. 22 is a table illustrating values of data D1, D2, D3, D4, D5, D6 and D7 according to reference voltages Ref_a, Ref_b, Ref_c, Ref_d, Ref_e, Ref_f and Ref_g, and values of 3 bit data X, Y and Z resulted from encoding data D1, D2, D3, D4, D5, D6 and D7.

Figure 23:
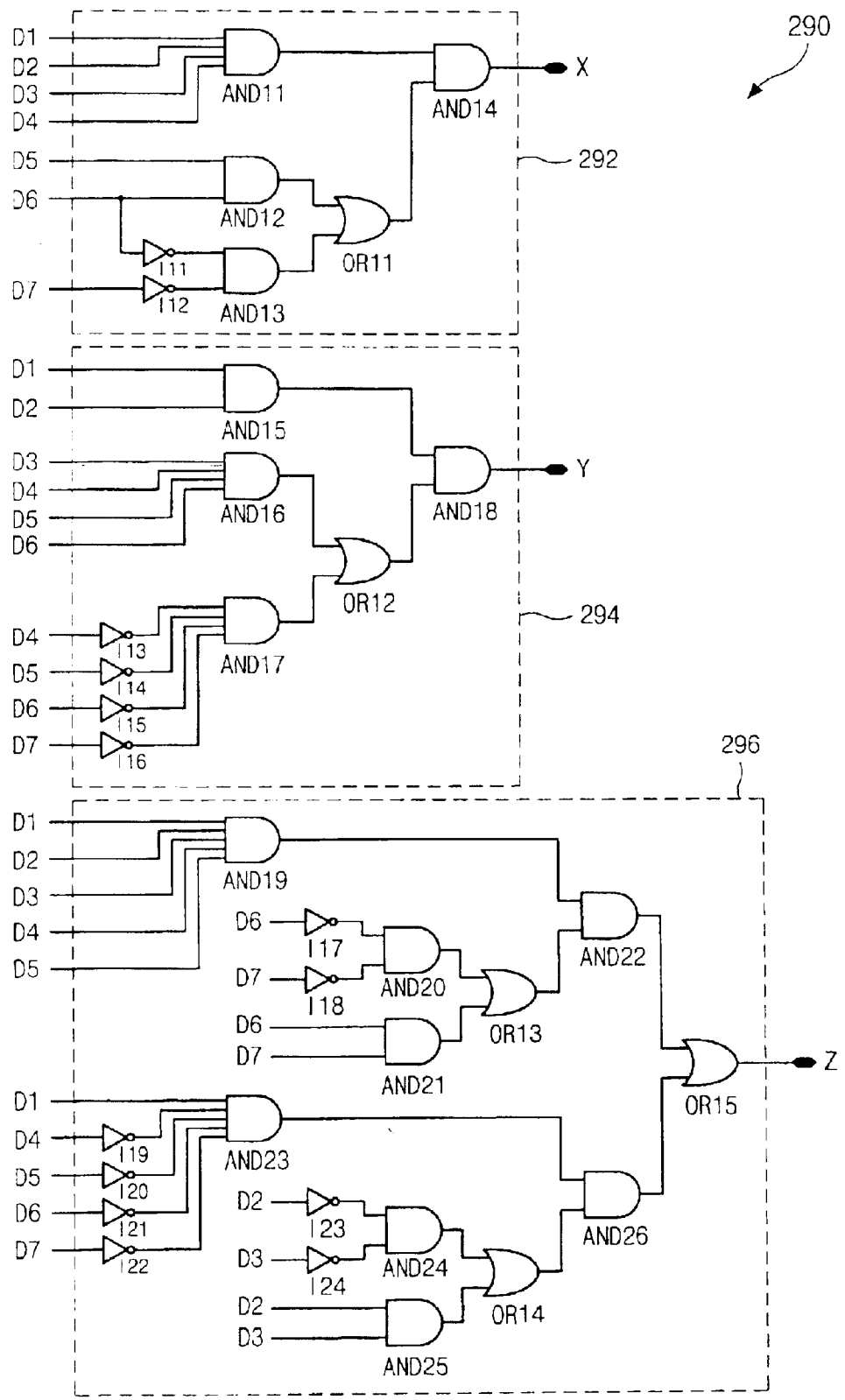
FIG. 23 illustrates a data encoder for making table values of FIG. 22.
Figure 24:
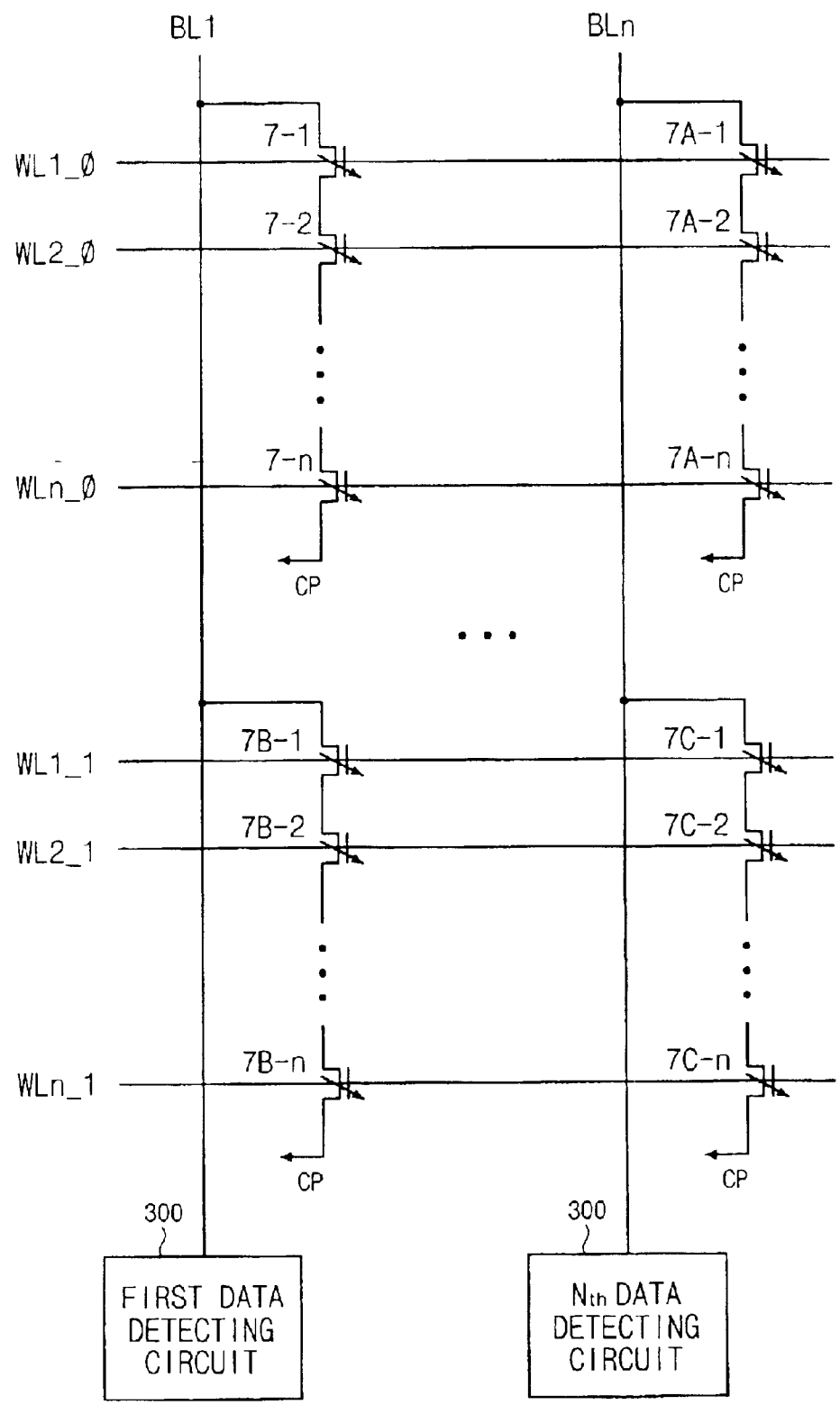
FIGS. 24 through 27 illustrate MRAM cell array and data detecting circuit, respectively.
Figure 25:
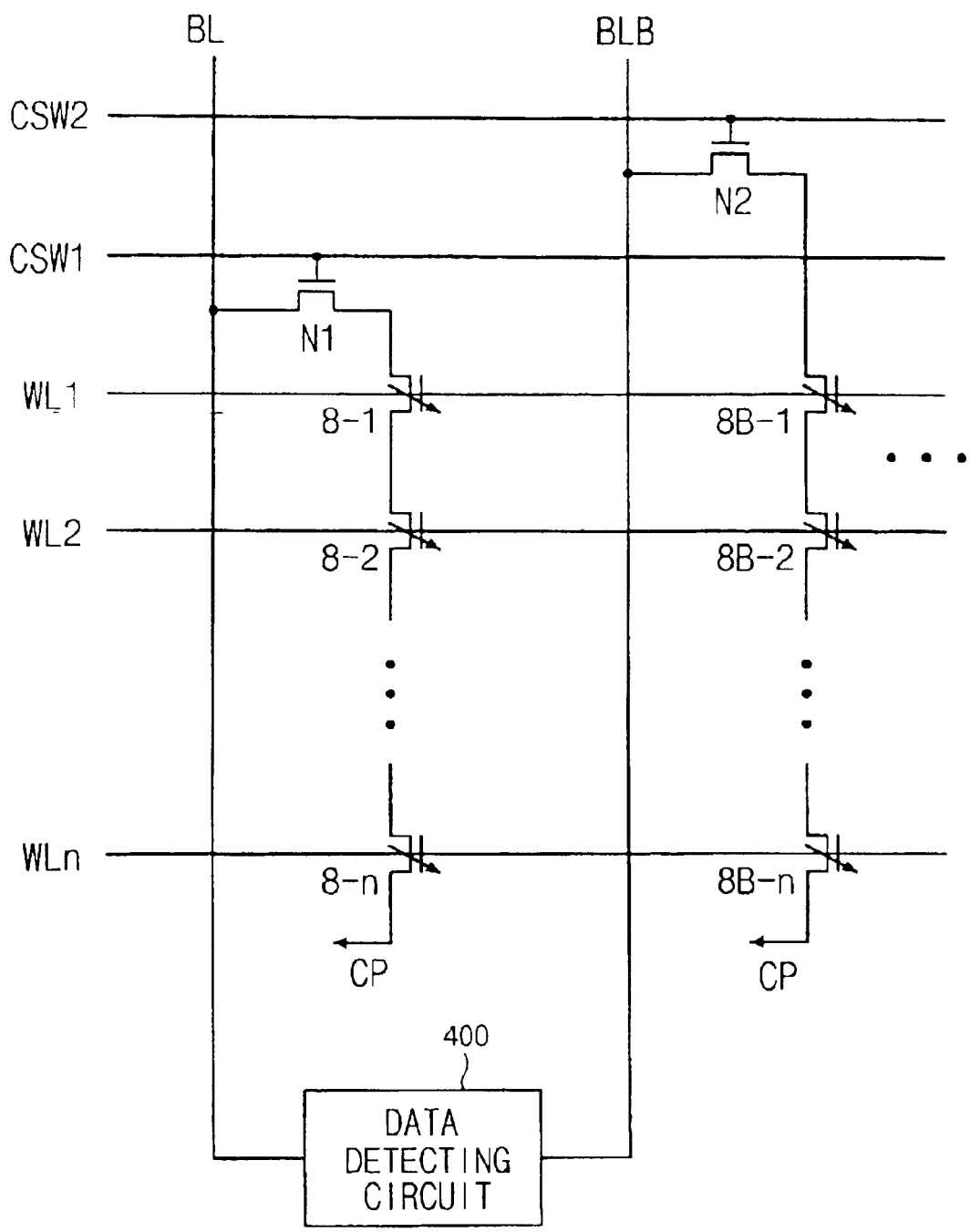
Figure 26:
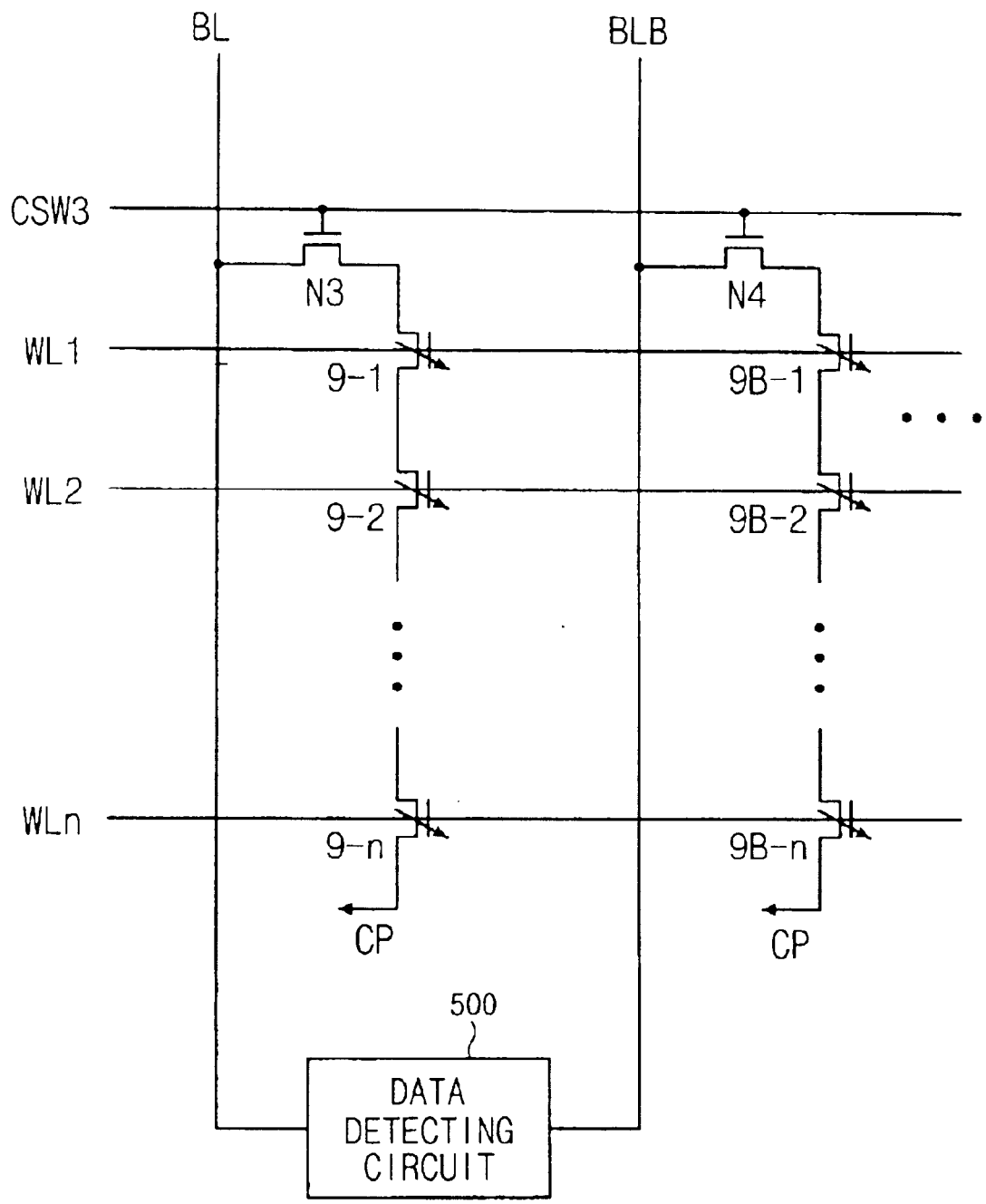
Figure 27:
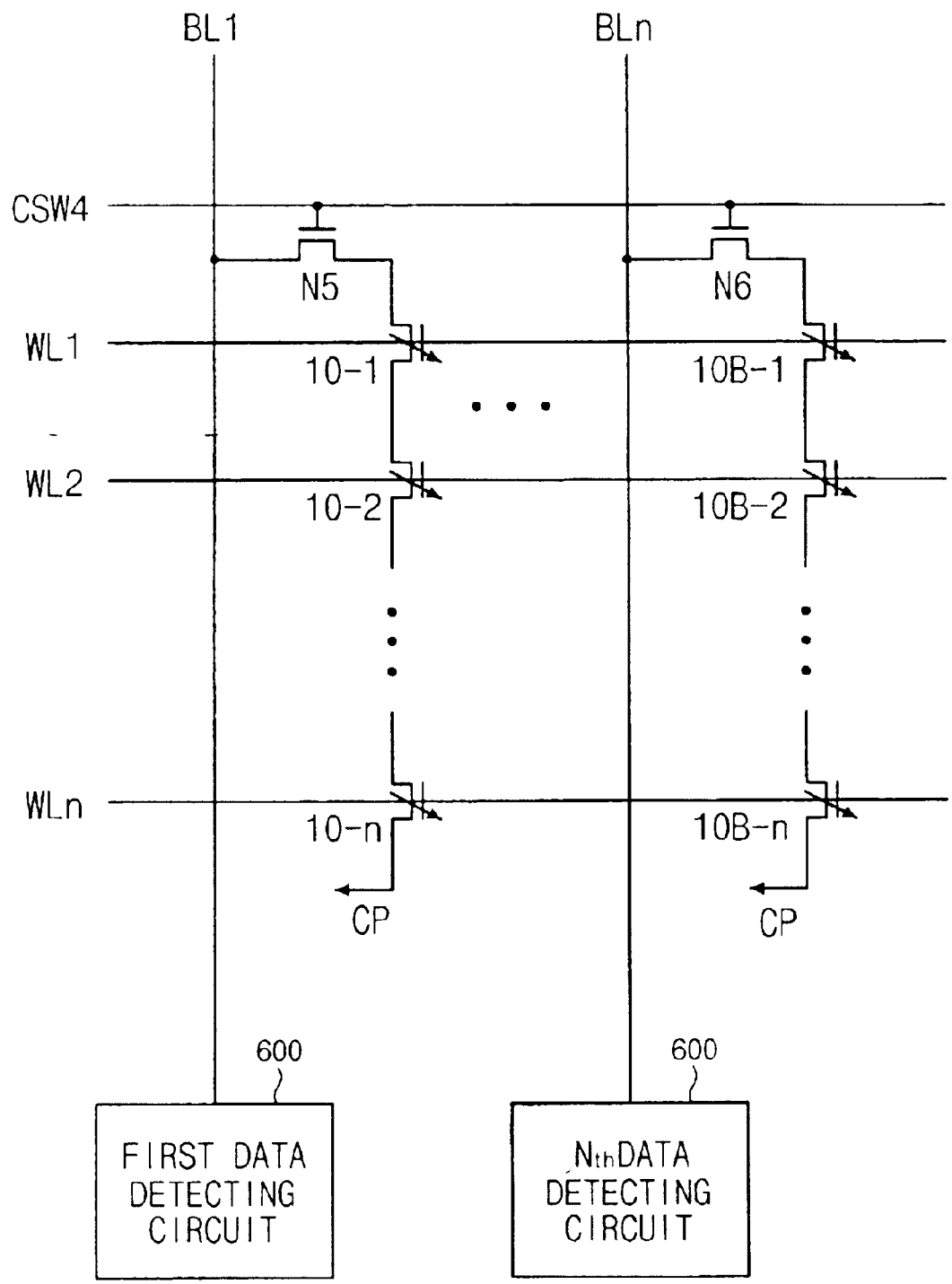

FIG. 23 is a logic circuit diagram of a data encoder for encoding data D1, D2, D3, D4, D5, D6 and D7 and generating 3 bit data X, Y and Z.

The data encoder 290 includes a first logic circuit 292, a second logic circuit 294 and a third logic circuit 296. The first logic circuit 292 encodes data D1, D2, D3, D4, D5, D6 and D7, and then generates data X. The second logic circuit 294 encodes data D1, D2, D3, D4, D5, D6 and D7, and then generates data Y. The third logic circuit 296 encodes D1, D2, D3, D4, D5, D6 and D7, and then generates data Z.

In the first logic circuit 292, an AND gate AND11 AND-combines data D1, D2, D3 and D4. An AND gate AND 12 AND-combines data D5 and D6. Inverters I11 and I12 respectively inverts data D6 and D7. An AND gate AND 13 AND-combines output signals of inverters I11 and I12. An OR gate OR11 OR-combines output signals of AND gates AND12 and AND 13. An AND gate AND 14 AND-combines output signals of the And gate AND11 and the OR gate OR11, and then outputs data X.

In the second logic circuit 294, an AND gate AND16 AND-combines data D1 and D2. An AND gate AND 16 AND-combines data D3, D4, D5 and D6. Inverters I13, I14, I15 and I16 respectively inverts data D4, D5, D6 and D7. An AND gate AND17 AND-combines output signals of inverters I13, I14, I15 and I16. An OR-gate OR12 OR-combines output signals of AND gates AND16 and AND17. An AND gate AND18 logically combines output signals of the OR gate OR12 and the AND gate And15, and then ouputs data Y.

In the third logic circuit 296, an AND gate AND19 AND-combines data D1, D2, D3, D4 and D5. Inverters I17 and I18 respectively inverts data D6 and D7. An AND gate AND20 AND-combines output signals of inverters I17 and I18. An AND gate AND21 AND-combines data D6 and D7. An OR gate OR13 OR-combines output signals of AND gates AND20 and AND21. An AND gate AND22 AND-combines output signals of the OR gate OR13 and the AND gate AND19. Inverters I19, I20, I21 and I22 invert data D4, D5, D6 and D7. An AND gate AND23 AND-combines output signals of inverters I19, I20, I21 and I22. Inverters I23 and I24 respectively inverts data D2 and D3. An AND gate AND24 AND-combines output signals of inverters I23 and I24. An AND gate AND25 AND-combines data D2 and D3. An OR gate OR14 OR-combines output signals of AND gates AND24 and AND25. An AND gate AND26 logically combines output signals of the AND gate AND23 and the OR gate OR26. An OR gate OR15 logically combines output signals of AND gates AND22 and AND26, and then output data Z.

the values of data X, Y and Z outputted from the data encoder 290 are exactly shown in FIG. 22.

FIGS. 24 through 27 illustrate MRAMs having different MRAM cell arrays.

MRAMs shown in FIGS. 24 through 27 have the same structure of MRAMs shown in FIGS. 10 through 13, except that data detecting circuit for detecting data levels according to magnetization orientation of MTJ are used instead of sense amplifiers. Accordingly, the structures of MRAMs shown in FIGS. 24 through 27 will not be explained.

data detecting circuits shown in FIGS. 24 through 27 have the same structures of data detecting circuits shown in FIGS. 16 and 20.

Figure 28:
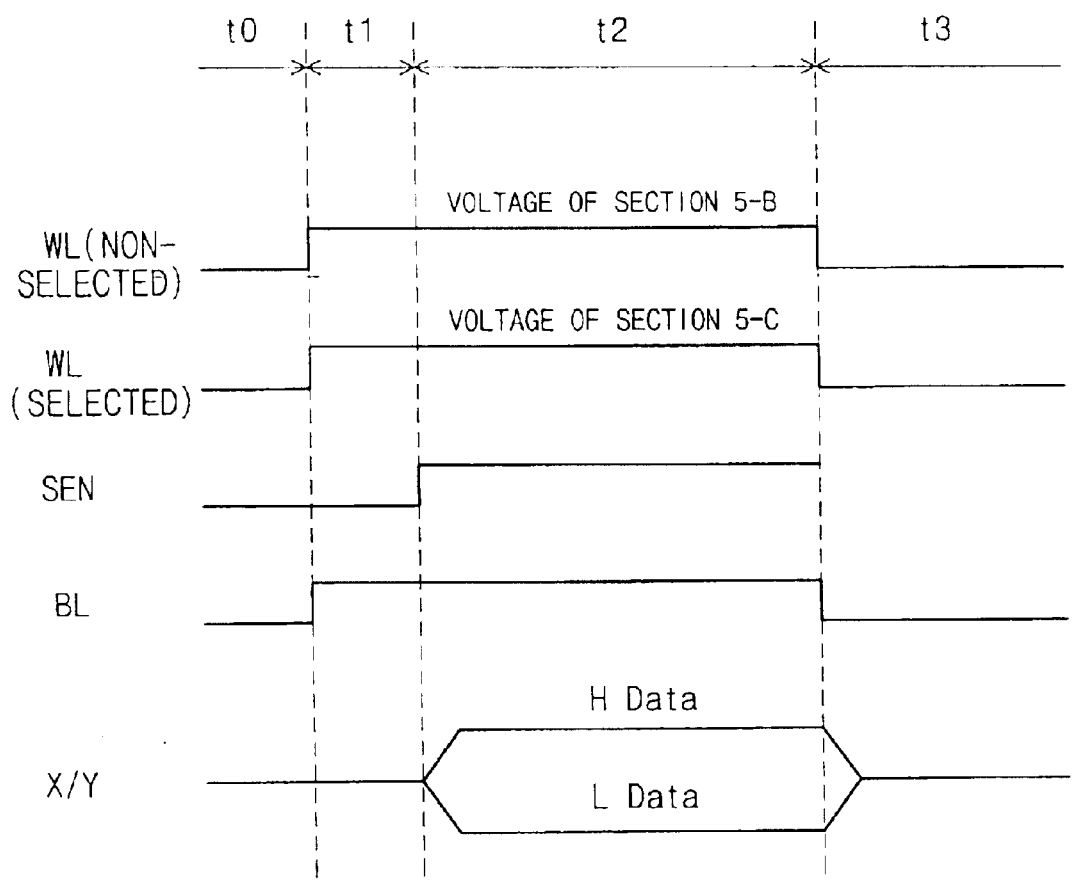
FIG. 28 illustrates a timing diagram during the read operation of an MRAM cell array for detecting the level of four data in accordance with the present invention.

FIG. 28 is a timing diagram during the read operation of an MRAM cell array for detecting four data A, B, C and D.

This read operation is divided into an initial section T0, a memory cell selecting section t1, a sense amplifier enable section t2 and a read terminating section t3.

In the initial section t0, bit lines and word lines maintain a low level voltage not to read data, and a sense amplifier is disabled.

In the memory cell selecting section t1, a large word line voltage is applied to a selected word line WL so that the read operation can be performed in Section 5-C of FIG. 8, thereby resulting in the difference of magnetization orientation. A small word line voltage is applied to a non-selected word line WL so that the read operation can be performed in Section 5-B of FIG. 8. Here, since a large word line voltage is applied to a selected word line, currents I1 and I2 are simultaneously generated. As a result, data stored in MRAM cell can be read. The data is stored in the MRAM cell, according to magnetization orientation of MTJ. Since a small word line voltage is applied to a non-selected word line, only current I2 is generated, and thereby, an MRAM cell is turned-on regardless of the magnetization orientation of MTJ. As a result, a current corresponding to data stored in an MRAM cell connected to a selected word line WL is applied to a bit line. Then, a sense amplifier enable section t2 is entered.

In the sense amplifier enable section t2, if a current needed tor read flows in a bit line, a sense amplifier activating signal SEN for activating a sense amplifier of a data detecting circuit is applied to a sense amplifier at the starting point of t2. Then, output signals of sense amplifiers SAa, SAb and SAc are generated by this sense amplifier activating signal SEN, thereby resulting in generating 2 bit data X and Y.

In the read terminating section t3, the next cycle is prepared.

Figure 29:
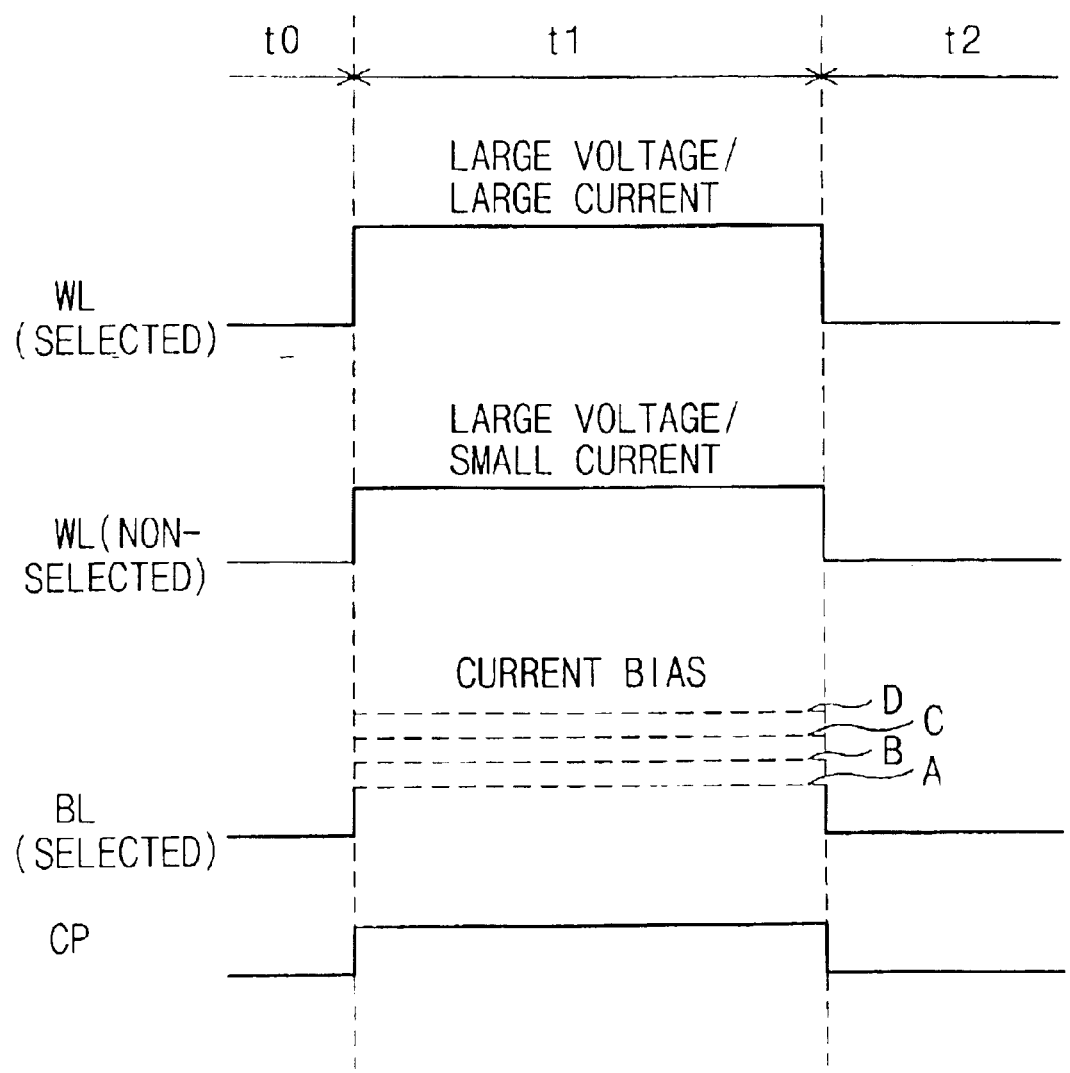
FIG. 29 illustrates a timing diagram during the write operation of an MRAM cell array for detecting the level of four data in accordance with the present invention.

FIG. 29 is a timing diagram during the write operation of an MRAM cell array for detecting four data A, B, C and D.

The write operation is divided into an initial section t0, a write section t1 and a write terminating section t2.

In the initial section t0, a ground voltage is applied to selected and non-selected word lines WL. When a memory cell selecting section t1 is entered, a voltage is applied to a selected word line WL.

In the write section t1, a large word line voltage is applied to a selected word line WL so that bit line current and word line current needed to write flow in a bit line and a word line. A bit line current becomes larger so that a word line current needed to write cannot flow in the non-selected word line WL. In other words, different voltages A, B, C and D needed to write are respectively applied to a bit line. Thereby, data can be written in the MRAM cell according to magnetization orientation based on current directions between a bit line BL and a cell plate CP.

Thereafter, in the write terminating section t2, a ground voltage is applied to a word line.

As described above, the magnetization orientation is determined by directions of a word line current and a bit line current. The direction of the bit line current is maintained at one direction, and the magnetization orientation may be determined by changing the direction of the word line current. When the direction of the word line current corresponding to a logic value of "0" is determined, a current flows in only a bit line BL of an MRAM cell for writing a logic value of "0". On the contrary, when the direction of the word line current corresponding to a logic value of "1" is determined, a current flows in only a bit line BL of an MRAM cell for writing the logic value of "1". Accordingly, the magnetization orientation is differently regulated according to directions of the word line current and the bit line current, and thus a plurality of data may be written to each MRAM cell, As described earlier, the present invention discloses an MRAM cell for storing data according to the magnetization orientation of an MTJ, thereby improving a process.

In addition, since data is read/written according to the magnetization orientation of an MTJ in an MRAM cell, the size of cell can be reduced, and the sensing margin can be improved.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A magnetic random access memory, comprising:
   an MRAM cell having source and drain regions formed in an active region of a semiconductor substrate; an insulating layer deposited on a channel region of a semiconductor substrate; and an MTJ stacked on the upper portion of the insulating layer,
   wherein data is written/read to/from the MRAM cell by adjusting/sensing magnetization orientation, based on a current flowing through the MTJ in the MRAM cell according to voltages applied to word lines of the MRAM cell.

2. The magnetic random access memory according to claim 1, wherein the MTJ includes a fixed ferromagnetic layer formed on the insulating layer, and a plurality of tunnel oxide films and a plurality of free ferromagnetic layers alternately staked on the fixed ferromagnetic layer.

3. The magnetic random access memory according to claim 1, wherein the data stored in the MRAM cell is read by sensing the magnetization orientation, based on a current flowing from the drain region to the source region according to a current flowing from a gate metal electrode of the upper portion of the MTJ to the source region when a voltage applied to a word line in the MRAM cell exceeds a threshold voltage and a tunneling voltage in the MRAM cell.

4. The magnetic random access memory according to claim 1, wherein the MRAM cell writes data by differently adjusting magnetization orientations, based on directions of the word line current and the bit line current generated by applying a write voltage to the word line and the bit line.

5. A magnetic random access memory, further comprising:
   an MRAM cell group consisting of a plurality of MRAM cells connected to each other in series between a bit line and a cell plate and having each gate connected to receive signals of a plurality of word lines; and
   a sense amplifier for sensing data applied to the bit line when receiving a sense amplifier enable signal.

6. The magnetic random access memory according to claim 5, wherein the MRAM cell group is respectively connected to a plurality of bit lines; and the plurality of bit lines are connected to two or more MRAM cell groups, respectively.

7. The magnetic random access memory according to claim 5, further comprising a switching device for controlling a driving of the MRAM cell group by a switching control signal.

8. The magnetic random access memory according to claim 5, wherein the MRAM cell comprises:
   source and drain regions formed in an active region of a semiconductor substrate;
   an insulating layer depostied on a channel region of semiconductor substrate;
   an MTJ stacked on the upper portion of the insulating layer,
   wherein data is written/read to/from the MRAM cell by adjusting/sensing magnetization orientation, based on a current of the MTJ according to voltages applied to word lines of the MRAM cell.

9. The magnetic random access according to claim 8, wherein the MTJ includes a fixed ferromagnetic layer formed on the insulating layer, and a plurality of tunnel oxide films and a plurality of free ferromagnetic layers alternately staked on the fixed ferromagnetic layer.

10. A magnetic random access memory, comprising:
    a first MRAM cell group consisting of a plurality of MRAM cells connected to each other in series between a bit line and a cell plate and having each gate connected to receive signals of a plurality of word lines;
    a second MRAM cell group consisting of a plurality of MRAM cells connected to each other in series between a bit line bar and a cell plate and having each gate connected to the signals of the plurality of word lines; and
    a sense amplifier connected between the bit line and the bit line bar, and for sensing data applied to the bit line and the bit line bar when receiving a sense amplifier enable signal.

11. The magnetic random access memory according to claim 10: wherein the bit line and the bit line bar are connected with two or more first and second MRAM cell groups, respectively.

12. The magnetic random access memory according to claim 10, further comprising:
    a first switching device for controlling a driving of the first MRAM cell group, using a first switching control signal; and
    a second switching device for controlling a driving of the second MRAM cell group, using a second switching control signal.

13. The magnetic random access memory according to claim 10, further comprising:
    a third switching device for controlling a driving of the first MRAM cell group, using a switching control signal; and
    a forth switching device for controlling a driving of the second MRAM cell group, using the switching control signal.

14. The MRAM according to claim 10, wherein each MRAM cell in the first and the second MRAM cell groups comprises:
    source and drain regions formed in an active region of a semiconductor substrate;
    an insulating layer deposited on a channel region of a semiconductor substrate; and
    an MTJ stacked on an upper portion of the insulating layer,
    wherein data is written/read to/from the MRAM cell by adjusting/sensing magnetization orientation, based on a current of the MTJ in the MRAM cell according to voltages applied to word lines of the MRAM cell.

15. The magnetic random access memory according to claim 14, wherein the MTJ includes a fixed ferromagnetic layer formed on the insulating layer, and a plurality of tunnel oxide films and a plurality of free ferromagnetic layers alternatively staked on the fixed ferromagnetic layer.

16. A magnetic random access memory comprising a data detecting circuit connected to a bit line, and for converting a current flowing through an MTJ in an MRAM cell into a voltage, and for detecting data based on the different magnetization orientation of the MTJ in the MRAM cell.

17. The magnetic random access memory according to claim 16, the data detecting circuit comprising:
    a current-voltage converting unit for converting a current flowing through the MTJ in the MRAM cell into a voltage and then generating data based on differences of magnetization orientations of the MTJ;
    a sense amplifier for generating and amplifying a plurality of data by using reference voltages having different values and the data generated from the current-voltage converting unit; and
    a data encoder for encoding the plurality of data generated from the sense amplifier and then generating the predetermined number of data.

18. The magnetic random access memory according to claim 17, wherein the current-voltage converting unit converts a current flowing through the MTJ in the MRAM cell into a voltage and then generates four data based on differences of magnetization orientations of the MTJ.

19. The magnetic random access memory according to claim 17, wherein the sense amplifier generates and amplifies 3 bit data, using reference voltages having different values and the data generated from the current-voltage converting unit.

20. The magnetic random access memory according to claim 19, wherein the data encoder encodes the 3 bit data and generates 2 bit data.

21. The magnetic random access memory according to claim 19, wherein the data encoder includes:
   a logic device for logically combining a first and a second data of the 3 bit data and generating one of the 2 bit data; and
   a logic circuit for logically combining the 3 bit data and generating another of the 2 bit data.

22. The magnetic random access memory according to claim 17, wherein the current-voltage converting unit converts a current flowing through the MTJ in the MRAM cell into a voltage and then generates eight data based on differences of magnetization orientations of the MTJ.

23. The magnetic random access memory according to claim 17, wherein the sense amplifier generates and amplifies 7 bit data by using a reference voltages having different values and the data generated from the current-voltage converting unit.

24. The magnetic random access memory according to claim 23, wherein the data encoder includes first, second and third logic circuits for encoding the 7 bit data and then generating 3 bit data.

25. A magnetic random access memory, comprising:
   an MRAM cell group consisting of a plurality of MRAM cells connected to each other in series between a bit line and a cell plate and having each gate connected to receive signals of a plurality of word lines; and
   a data detecting circuit connected to the bit line, and for converting a current flowing through an MTJ in the MRAM cell group into a voltage and for detecting data based on differences of magnetization orientations of the MTJ in the MRAM cell group.

26. The magnetic random access memory according to claim 25, wherein the MRAM cell group is respectively connected to a plurality of bit lines; and the plurality of bit lines are connected with two or more MRAM cell groups, respectively.

27. The magnetic random access memory according to claim 25, further comprising a switching device for controlling a driving of the MRAM cell group according to a switching control signal.

28. The magnetic random access memory accordng to claim 25, wherein each MRAM cell in the MRAM cell group comprises:
   source and drain regions formed in an active region of a semiconductor substrate;
   an insulating layer deposited on a channel region of a semiconductor substrate; and
   an MTJ stacked on the upper portion of the insulating layer;
   wherein data is written/read to/from the MRAM cell by adjusting/sensing a current flowing through the MTJ in the MRAM cell according to voltages applied to word lines of the MRAM cell.

29. The magnetic random access memory according to claim 28, wherein the MTJ includes a fixed ferromagnetic layer formed on the insulating layer, and a plurality of tunnel oxide films and a plurality of free ferromagnetic layers alternatively staked on the fixed ferromagnetic layer.

30. The magnetic random access memory according to claim 25, wherein the data detecting circuit comprises:
   a current-voltage converting unit for converting a current flowing through the MTJ in the MRAM cell into a voltage and then generating data based on differences of magnetization orientations of the MTJ;
   a sense amplifier for generating and amplifying a plurality of data by using reference voltages having different values and the data generated from the current-voltage converting unit; and
   a data encoder for encoding the plurality of data generated from the sense amplifier and then generating the predetermined number of data.

31. The magnetic random access memory according to claim 30, wherein the current-voltage converting unit converts a current flow through the MTJ in the MRAM cell into a voltage and then generates four data based on differences of magnetization orientations of the MTJ.

32. The magnetic random access memory according to claim 30, wherein the sense amplifier generates and amplifies a 3 bit data, using reference voltages having different values and the data generated from the current-voltage converting unit.

33. The magnetic random access memory according to claim 32, wherein the data encoder encodes the 3 bit data and generates a 2 bit data.

34. The magnetic random access memory according to claim 32, wherein the data encoder includes:
   a logic device for logically combining a first and a second data of the 3 bit data and generating one of the 2 bit data; and
   a logic circuit for logically combining the 3 bit data and generating another of the 2 bit data.

35. The magnetic random access memory according to claim 30, wherein the current-voltage converting unit converts a current flowing through the MTJ in the MRAM cell into a voltage and then generates eight data based on differences of magnetization orientations of the MTJ.

36. The magnetic random access memory according to claim 30, wherein the sense amplifier generates and amplifies 7 bit data by using reference voltages having different values and the data generated from the current-voltage converting unit.

37. The magnetic random access memory according to claim 36, wherein the data encoder includes first, second and third logic circuits for encoding the 7 bit data and then generating 3 bit data.

38. A magnetic random access memory, comprising:
   a first MRAM cell group consisting of a plurality of MRAM cells connected to each other in series between a bit line and a cell plate, and having each gate connected to receive signals of a plurality of word lines;
   a second MRAM cell group consisting of a plurality of MRAM cells connected to each other in series between a bit line and a cell plate, and having each gate connected to receive the signals of the plurality of word lines; and
   a data detecting circuit connected between the bit line and the bit line bar, and for converting currents flowing through an MTJ in the first and the second MRAM cell groups into voltages and detecting data based on differences of magnetization orientations of the MTJ in the first and the second MRAM cell groups.

39. The magnetic random access memory according to claim 38, wherein the bit line and the bit line bar are connected with two or more first and second MRAM cell groups, respectively.

40. The magnetic random access memory according to claim 38, further comprising:

a first switching device for controlling a driving of the first MRAM cell group by a first switching control signal; and a second switching device for controlling a driving of the second MRAM cell group by a second switching control signal.

41. The magnetic random access memory according to claim 38, further comprising:

a third switching device for controlling a driving of the third MRAM cell group by a third switching control signal; and a fourth switching device for controlling a driving of the fourth MRAM cell group by to a fourth switching control signal.

42. The magnetic random access memory according to claim 38, wherein each MRAM cell of the first and the second MRAM cell groups comprises:

source and drain regions formed in an active region of a semiconductor substrate;

an insulating layer deposited on a channel region of a semiconductor substrate; and an MTJ stacked on an upper portion of the insulating layer, wherein data is written/read to/from the MRAM cell by adjusting/sensing a current of the MTJ according to voltages applied to word lines of the MRAM cell.

43. The magnetic random access memory according to claim 42, wherein the MTJ includes a fixed ferromagnetic layer formed on the insulating layer, and a plurality of tunnel oxide films and a plurality of free ferromagnetic layers alternatively staked on the fixed ferromagnetic layer.

44. The magnetic random access memory according to claim 38, wherein the data detecting circuit comprises:

a current-voltage converting unit for converting a current flowing through the MTJ into a voltage and then generating data based on differences of magnetization orientations of the MTJ;

a sense amplifier for generating and amplifying a plurality of data by using reference voltages having different values and the data generated from the current-voltage converting unit; and a data encoder for encoding the plurality of data generated from the sense amplifier and then generating the predetermined number of data.

45. The magnetic random access memory according to claim 44, wherein the current-voltage converting unit converts currents flowing through the MTJ into voltages generates four data based on differences of magnetization orientations of the MTJ.

46. The magnetic random access memory according to claim 44, wherein the sense amplifier generates and amplifies 3 bit data, using reference voltages having different values and the data generated from the current-voltage converting unit.

47. The magnetic random access memory according to claim 46, wherein the data encoder encodes the 3 bit data and generates 2 bit data.

48. The magnetic random access memory according to claim 46, wherein the data encoder includes:

a logic device for generating logically combining a first and a second data of the 3 bit data and generating one of the 2 bit data; and a logic circuit for logically combining the 3 bit data and generating another of the 2 bit data.

49. The magnetic random access memory according to claim 44, wherein the current-voltage converting unit converts and currents flowing through the MTJ into voltages and then generates eight data based on differences of magnetization orientations of the MTJ.

50. The magnetic random access memory according to claim 44, wherein the sense amplifier generates and amplifies 7 bit data by using reference voltages having defferent values and the data generated from the current-voltage converting unit.

51. The MRAM according to claim 50, wherein the data encoder includes first, second and third logic circuits for encoding the 7 bit data and then generating 3 bit data.

* * * * *